(12) United States Patent
Yamabi et al.

(10) Patent No.: US 11,069,729 B2
(45) Date of Patent: Jul. 20, 2021

(54) PHOTOELECTRIC CONVERSION DEVICE, AND EQUIPMENT

(71) Applicant: CANON KABUSHIKI KAISHA, Tokyo (JP)

(72) Inventors: Satoshi Yamabi, Yokohama (JP); Yoshinori Kotani, Yokohama (JP); Akio Kashiwazaki, Yokohama (JP); Yoshihiro Ohashi, Tokyo (JP); Masami Tsukamoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 14 days.

(21) Appl. No.: 16/393,257

(22) Filed: Apr. 24, 2019

(65) Prior Publication Data

US 2019/0341409 A1 Nov. 7, 2019

(30) Foreign Application Priority Data

May 1, 2018 (JP) .............................. JP2018-088352
Mar. 28, 2019 (JP) .............................. JP2019-063132

(51) Int. Cl.
*H01L 27/14* (2006.01)
*H01L 27/146* (2006.01)
*H04N 5/225* (2006.01)
*G02B 1/111* (2015.01)

(52) U.S. Cl.
CPC .......... *H01L 27/1462* (2013.01); *G02B 1/111* (2013.01); *H01L 27/14618* (2013.01); *H01L 27/14627* (2013.01); *H01L 27/14645* (2013.01); *H04N 5/2253* (2013.01); *H04N 5/2254* (2013.01)

(58) Field of Classification Search
CPC .... H01L 33/502; H01L 33/486; H01L 33/644
USPC ......................................................... 257/98
See application file for complete search history.

(56) References Cited

U.S. PATENT DOCUMENTS 7,316,937 B2   1/2008  Kojima et al.
7,767,485 B2   8/2010  Ogawa et al.
9,293,488 B2 * 3/2016  Tu ..................... H01L 27/14621
(Continued)

FOREIGN PATENT DOCUMENTS

JP      2003-031782 A    1/2003
JP      2003-266606 A    9/2003
(Continued)

OTHER PUBLICATIONS

Chih-Hao Chang, Dielectric film has refractive index close to air, NC State university, Oct. 12, 2015 (Year: 2015).*

*Primary Examiner* — Sheikh Maruf
(74) *Attorney, Agent, or Firm* — Venable LLP

(57) ABSTRACT

A photoelectric conversion device, including: a photoelectric conversion substrate having a plurality of photoelectric conversion portions and a microlens array arranged on the plurality of photoelectric conversion portions; a light-transmitting plate covering the microlens array; and a film arranged between the microlens array and the light-transmitting plate, wherein the film has a refractive index within a range from 1.05 to 1.15, an average transmittance of light in a wavelength region within a range from 400 nm to 700 nm of 98.5% or higher, and a film thickness within a range from 500 nm to 5000 nm.

32 Claims, 13 Drawing Sheets

(56) References Cited

U.S. PATENT DOCUMENTS

| | | | |
|---|---|---|---|
| 2002/0027284 A1* | 3/2002 | Ono | H01L 27/14623 257/704 |
| 2004/0209068 A1* | 10/2004 | Lin | C08J 7/0427 428/323 |
| 2005/0253213 A1* | 11/2005 | Jiang | H01L 27/14618 257/433 |
| 2005/0277268 A1* | 12/2005 | Hoshika | H01L 27/14618 438/457 |
| 2006/0043544 A1* | 3/2006 | Tsukamoto | H01L 27/14685 257/666 |
| 2006/0054946 A1* | 3/2006 | Baek | H01L 27/14627 257/292 |
| 2006/0172453 A1* | 8/2006 | Sakoh | H01L 27/14627 438/72 |
| 2007/0030380 A1* | 2/2007 | Higuchi | H01L 27/14685 348/340 |
| 2007/0108545 A1* | 5/2007 | Chua | H01L 31/18 257/433 |
| 2007/0109439 A1 | 5/2007 | Minamio et al. | |
| 2008/0042227 A1 | 2/2008 | Asano et al. | |
| 2009/0053850 A1* | 2/2009 | Nishida | H01L 27/14618 438/64 |
| 2009/0059055 A1* | 3/2009 | Nakano | H01L 27/14618 348/340 |
| 2010/0044816 A1 | 2/2010 | Minamio et al. | |
| 2010/0066876 A1* | 3/2010 | Kurihara | H04N 5/2254 348/273 |
| 2010/0289939 A1* | 11/2010 | Ogino | H01L 33/58 348/340 |
| 2013/0175649 A1* | 7/2013 | Eromaki | H01L 27/14601 257/432 |
| 2014/0151838 A1* | 6/2014 | Iizuka | H01L 23/564 257/433 |
| 2014/0377531 A1* | 12/2014 | Momoki | G02B 1/115 428/313.3 |
| 2015/0008555 A1* | 1/2015 | Mizuta | H01L 27/14627 257/432 |
| 2015/0084148 A1* | 3/2015 | Oganesian | H01L 27/14632 257/433 |
| 2015/0249102 A1* | 9/2015 | Terada | H01L 27/14687 257/444 |
| 2015/0331150 A1 | 11/2015 | Furholz et al. | |
| 2016/0118506 A1* | 4/2016 | Liu | G01J 5/024 257/433 |
| 2016/0293650 A1* | 10/2016 | Kimura | H01L 27/14627 |
| 2016/0304730 A1* | 10/2016 | Hitomi | C08L 63/00 |
| 2017/0092680 A1* | 3/2017 | Kwon | H01L 23/5226 |
| 2017/0117320 A1* | 4/2017 | Matsugai | H01L 27/14618 |
| 2017/0236860 A1* | 8/2017 | Yamamoto | H01L 27/14645 257/432 |
| 2018/0061879 A1 | 3/2018 | Kurihara et al. | |
| 2018/0097029 A1* | 4/2018 | Kurihara | H01L 27/14618 |
| 2018/0114805 A1* | 4/2018 | Takiguchi | G02B 5/208 |
| 2018/0331142 A1* | 11/2018 | Yamamoto | H01L 27/14645 |
| 2019/0341409 A1* | 11/2019 | Yamabi | H01L 27/14632 |
| 2019/0385968 A1* | 12/2019 | Fujimagari | H01L 27/1462 |

FOREIGN PATENT DOCUMENTS

| | | |
|---|---|---|
| JP | 2005-026314 A | 1/2005 |
| JP | 2010-040621 A | 2/2010 |
| JP | 2012-032673 A | 2/2012 |
| JP | 2014-228614 A | 12/2014 |
| JP | 2015-004753 A | 1/2015 |
| JP | 2018-032792 A | 3/2018 |
| WO | 2015/190374 A1 | 12/2015 |

* cited by examiner

PHOTOELECTRIC CONVERSION DEVICE, AND EQUIPMENT

BACKGROUND OF THE INVENTION

Field of the Invention

The present disclosure relates to a photoelectric conversion device, and an equipment.

Description of the Related Art

In recent years, a semiconductor packaging technique called a wafer level chip size package (WL-CSP) has been attracting attention. In WL-CSP, all processes including wiring, electrode formation, encapsulation, and dicing are performed while still in a wafer state and a size of an ultimately cut chip is adopted as a package size.

Structures of photoelectric conversion devices fabricated by WL-CSP include a cavity structure in which a space between a microlens array and a light-transmitting plate is hollow and a cavity-less structure in which a solid substance with a lower refractive index that is relatively lower than that of a microlens is arranged between the microlens array and the light-transmitting plate.

Conventional photoelectric conversion devices have generally been adopted a cavity structure. However, being a hollow structure, a cavity structure tends to have low strength. In addition, since a frame-shaped adhesive layer must be formed around the cavity in order to support the light-transmitting plate, the photoelectric conversion device tends to increase in size, resulting in higher cost.

In contrast, since a solid substance is arranged between the microlens array and the light-transmitting plate so as to cover the microlenses in a cavity-less structure, the cavity-less structure is superior in strength and no longer requires a frame-shaped adhesive layer formed around the cavity. Therefore, the photoelectric conversion device can be downsized and, accordingly, cost can be reduced.

Furthermore, a condensing property of a microlens is dependent on a refractive index of the microlens and a refractive index of a solid substance covering the microlens and, the larger a difference between the refractive indexes, the higher the condensing property.

In the case of a cavity structure, since the substance arranged so as to cover the microlens is air with a refractive index of 1.0, a sufficient condensing property can be obtained even if a material of the microlenses is a resin with a refractive index within a range from 1.5 to 1.6.

However, in a cavity-less structure, since the refractive index of the solid substance covering the microlenses is higher than that of air, the condensing property is lowered when using microlenses with a refractive index similar to that in the case of a cavity structure.

In a cavity-less structure disclosed in Japanese Patent Application Laid-open No. 2010-040621, since a material of a microlens is an acrylic resin or the like with a refractive index within a range from 1.5 to 1.6, a low-refractive index material such as fluoropolymer with a refractive index of around 1.3 is used as a solid substance for covering the microlens.

In Japanese Patent Application Laid-open No. 2005-026314, since a resin material with a refractive index of 1.5 is used as a solid substance for covering the microlens, a high-refractive index microlens with a refractive index within a range from 1.7 to 2.1 is used.

A representative low-refractive index light-transmitting film is a porous film using hollow particles.

Japanese Patent Application Laid-open No. 2014-228614 discloses a light transmissive material in which hollow particles and voids coexist inside a light transmissive matrix.

Japanese Patent Application Laid-open No. 2015-4753 discloses a low-refractive index film of which strength is enhanced by coating a close-packed hollow particle layer with a binder mainly containing $SiO_2$.

Meanwhile, Japanese Patent Application Laid-open No. 2012-032673 discloses a low-refractive index film capable of forming a pattern which has a low refractive index, superior adhesiveness with respect to a substrate, and a small refractive index variation under high temperature and high humidity and which exhibits superior weather-resistant performance.

In addition, Japanese Patent Application Laid-open No. 2003-266606 discloses a material having sufficient antireflection performance with only a single-layer antireflective film.

Furthermore, Japanese Patent Application Laid-open No. 2018-032792 discloses a technique for improving binding between a light-transmitting plate and a photoelectric conversion substrate.

SUMMARY OF THE INVENTION

The cavity-less structure disclosed in Japanese Patent Application Laid-open No. 2010-040621 uses a microlens coating layer with a low refractive index in order to increase difference in refractive indexes between a microlens and the microlens coating layer. However, since the difference in refractive indexes is still small, a condensing property of the microlens may be lowered.

The cavity-less structure disclosed in Japanese Patent Application Laid-open No. 2005-026314 uses a high-refractive index microlens in order to increase a difference in refractive indexes between the microlens and a microlens coating layer. However, a process of forming a microlens with a material having a high refractive index, such as silicon nitride, requires advanced techniques and incurs high cost.

With the light transmissive material disclosed in Japanese Patent Application Laid-open No. 2014-228614, since a porosity of voids relative to a total volume of the light transmissive material is small, the refractive index may possibly increase. In addition, since sizes of the voids are not controlled, there is a risk that transmittance may decrease.

With the low-refractive index film disclosed in Japanese Patent Application Laid-open No. 2015-4753, since hollow particles are close-packed or, in other words, since a volume of pores formed between the hollow particles is minimized and the pores are filled with a binder, a reduction of the refractive index is insufficient even though high transmittance can be obtained. Therefore, the low-refractive index film is not suitable as a light-transmitting film to be used in an optical device.

In addition, the light-transmitting film materials disclosed in Japanese Patent Application Laid-open No. 2012-032673 and Japanese Patent Application Laid-open No. 2003-266606 do not have sufficient film strength which is practically required for device processing.

Furthermore, a photoelectric conversion device that is better than the photoelectric conversion device described in Japanese Patent Application Laid-open No. 2018-032792 is required.

In other words, the present disclosure provides a photoelectric conversion device and an equipment with superior optical characteristics.

The present disclosure relates to a photoelectric conversion device, including:

a photoelectric conversion substrate having a plurality of photoelectric conversion portions and a microlens array arranged on the plurality of photoelectric conversion portions;

a light-transmitting plate covering the microlens array; and a film arranged between the microlens array and the light-transmitting plate, wherein the film has a refractive index within a range from 1.05 to 1.15, an average transmittance of light in a wavelength region within a range from 400 nm to 700 nm of 98.5% or higher, and a film thickness within a range from 500 nm to 5000 nm.

In addition, the present disclosure relates to an equipment including:

the photoelectric conversion device described above; and at least one selected from the group consisting of an optical system for forming an optical image on the photoelectric conversion device, a control device which controls the photoelectric conversion device, a processing device which processes a signal output from the photoelectric conversion device, a moving device which moves the photoelectric conversion device, and a display device which displays information based on a signal output from the photoelectric conversion device.

Furthermore, the present disclosure relates to a photoelectric conversion device, including:

a photoelectric conversion substrate having a plurality of photoelectric conversion portions and a microlens array arranged on the plurality of photoelectric conversion portions;

a light-transmitting plate covering the microlens array; and a film arranged between the microlens array and the light-transmitting plate, wherein the film contains a plurality of hollow particles, and assuming that a ratio of a total volume of pores inside the plurality of hollow particles relative to a unit volume of the film is taken as a porosity X (%) and a ratio of a total volume of pores between the hollow particles relative to the unit volume of the film is taken as a porosity Y (%), a relationship expressed as X<Y is satisfied.

According to the present disclosure, a photoelectric conversion device and an equipment with superior optical characteristics can be provided.

Further features of the present invention will become apparent from the following description of exemplary embodiments with reference to the attached drawings.

DESCRIPTION OF THE EMBODIMENTS

Figure 1:
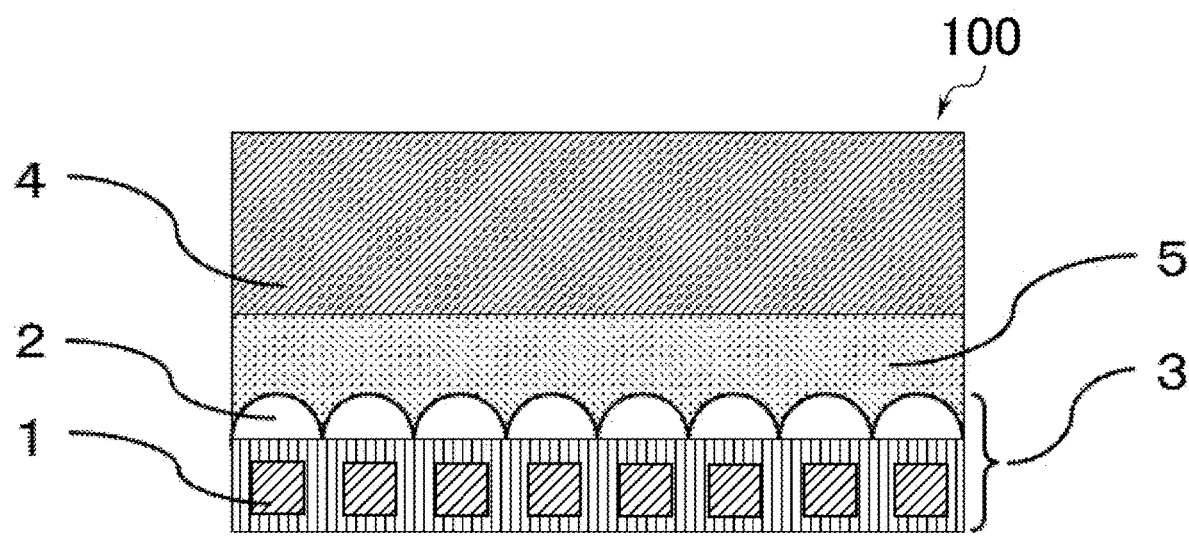
FIG. 1 is an example of a sectional view showing a configuration of a photoelectric conversion device.

In the present disclosure, unless otherwise noted, a description of "from XX to YY" or "XX to YY" representing a numerical value range is to signify the numerical value range including a lower limit end point and an upper limit end point thereof. In addition, a description of "A and/or B" represents a concept that encompasses all of a case of A, a case of B, and a case of both A and B.

Hereinafter, embodiments of the present disclosure will be described with reference to the accompanying drawings. In the following description and in the drawings, components common to a plurality of drawings are denoted by common reference characters. Therefore, common components will be described by mutually referring to the plurality of drawings and descriptions of components denoted by common reference characters will be omitted as deemed appropriate. The respective embodiments can be appropriately modified and combined with each other. In order to facilitate understanding of described elements, scales of the respective elements in the accompanying drawings may differ from those of an actual device.

A photoelectric conversion device includes:

a photoelectric conversion substrate having a plurality of photoelectric conversion portions and a microlens array arranged on the plurality of photoelectric conversion portions;

a light-transmitting plate covering the microlens array; and a film arranged between the microlens array and the light-transmitting plate, wherein the film has a refractive index within a range from 1.05 to 1.15, an average transmittance of light in a wavelength region within a range from 400 nm to 700 nm of 98.5% or higher, and a film thickness within a range from 500 nm to 5000 nm.

FIG. 1 is an example of a sectional view showing a configuration of a photoelectric conversion device 100.

The photoelectric conversion device 100 is constituted by: a photoelectric conversion substrate 3 having a photoelectric conversion portion 1 and a microlens array 2; a light-transmitting plate 4; and a functional film 5. As will be described later, the functional film 5 may be a multi-functional film having various optical and/or mechanical functions. From the perspective of the functional film 5 having particularly superior optical characteristics, the functional film 5 can be referred to as an optical film. Hereinafter, unless specifically stated to the contrary, it is to be understood that a term "film" refers to the functional film 5.

In FIG. 1, the functional film 5 is arranged between the microlens array 2 and the light-transmitting plate 4 and has a surface along irregularities of the microlens array 2 and a surface along the light-transmitting plate 4. The microlens array 2 is made up of a plurality of two-dimensionally arranged microlenses, and a width of each microlens is within a range from, for example, 0.5 µm to 10 µm and a height of each microlens is within a range from, for example, 0.3 µm to 3 µm. Therefore, a difference in height of the irregularities of the microlens array 2 is within a range from, for example, 0.3 µm to 3 µm.

Since the photoelectric conversion device 100 has a cavity-less structure in which the functional film 5 is arranged between the photoelectric conversion substrate 3 and the light-transmitting plate 4, the photoelectric conversion device 100 is more superior in terms of mechanical strength than a cavity structure in which a hollow space exists between the photoelectric conversion substrate 3 and the light-transmitting plate 4. From the perspective of the functional film 5 filling a space between the photoelectric conversion substrate 3 and the light-transmitting plate 4, the functional film 5 can also be referred to as a filling film.

Figure 5:
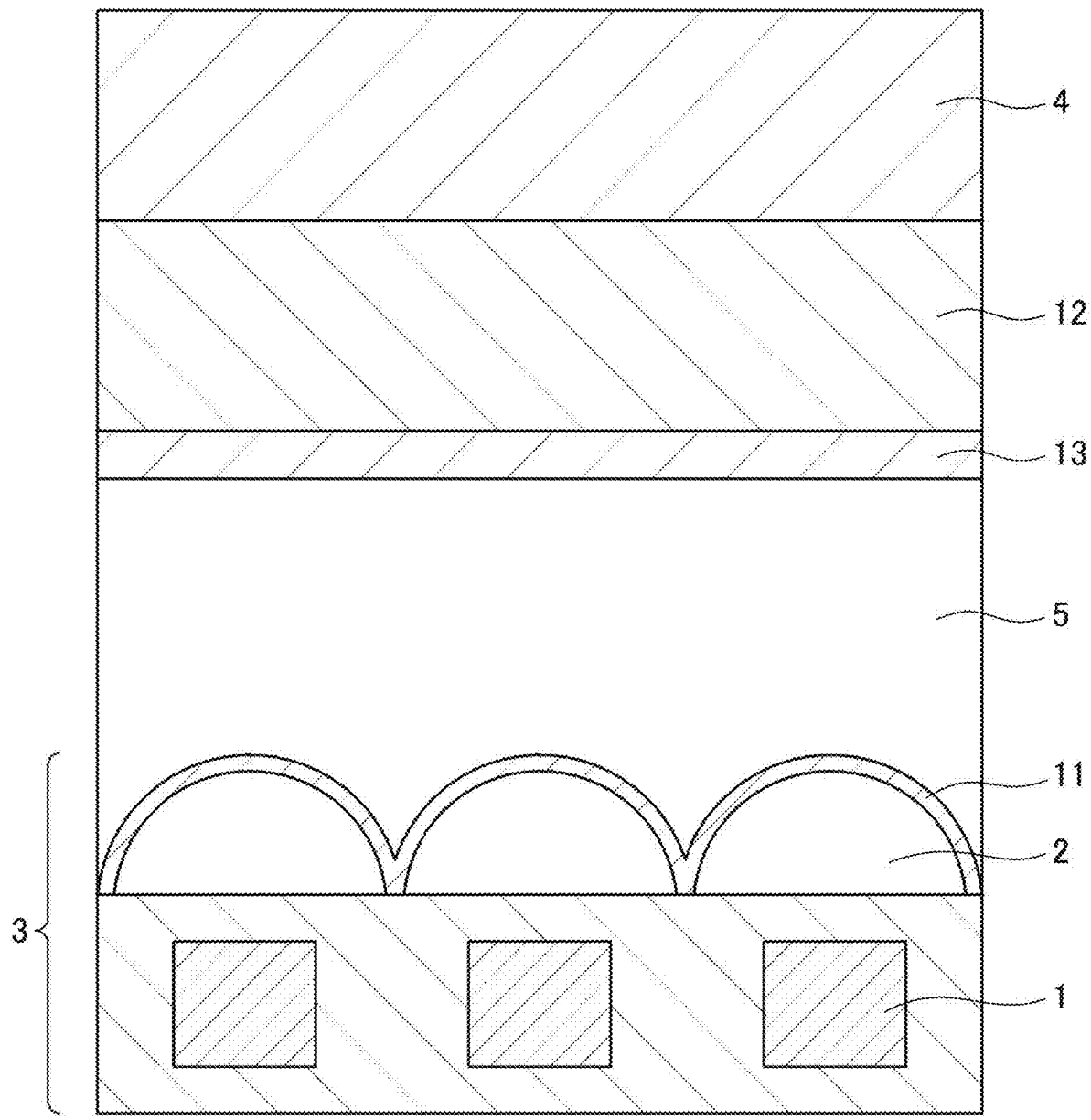
FIG. 5 is an example of a sectional view showing a configuration of a photoelectric conversion device.

FIG. 5 is another example of a sectional view showing a configuration of the photoelectric conversion device 100.

A binding member 12 is arranged between the functional film 5 and the light-transmitting plate 4 and binds the functional film 5 and the light-transmitting plate 4 with each other. In addition, an antireflection layer 13 may be arranged as necessary between the functional film 5 and the binding member 12. Furthermore, an antireflection layer 11 may be arranged as necessary between the functional film 5 and the microlens array 2.

An upper surface and a lower surface of the antireflection layer 11 have irregularities in accordance with the irregularities of the microlens array 2. The antireflection layers 11 and 13 may be thinner than the functional film 5 and thicknesses of the antireflection layers 11 and 13 may be equal to or less than ¼ of a thickness of the functional film 5.

Figure 6:
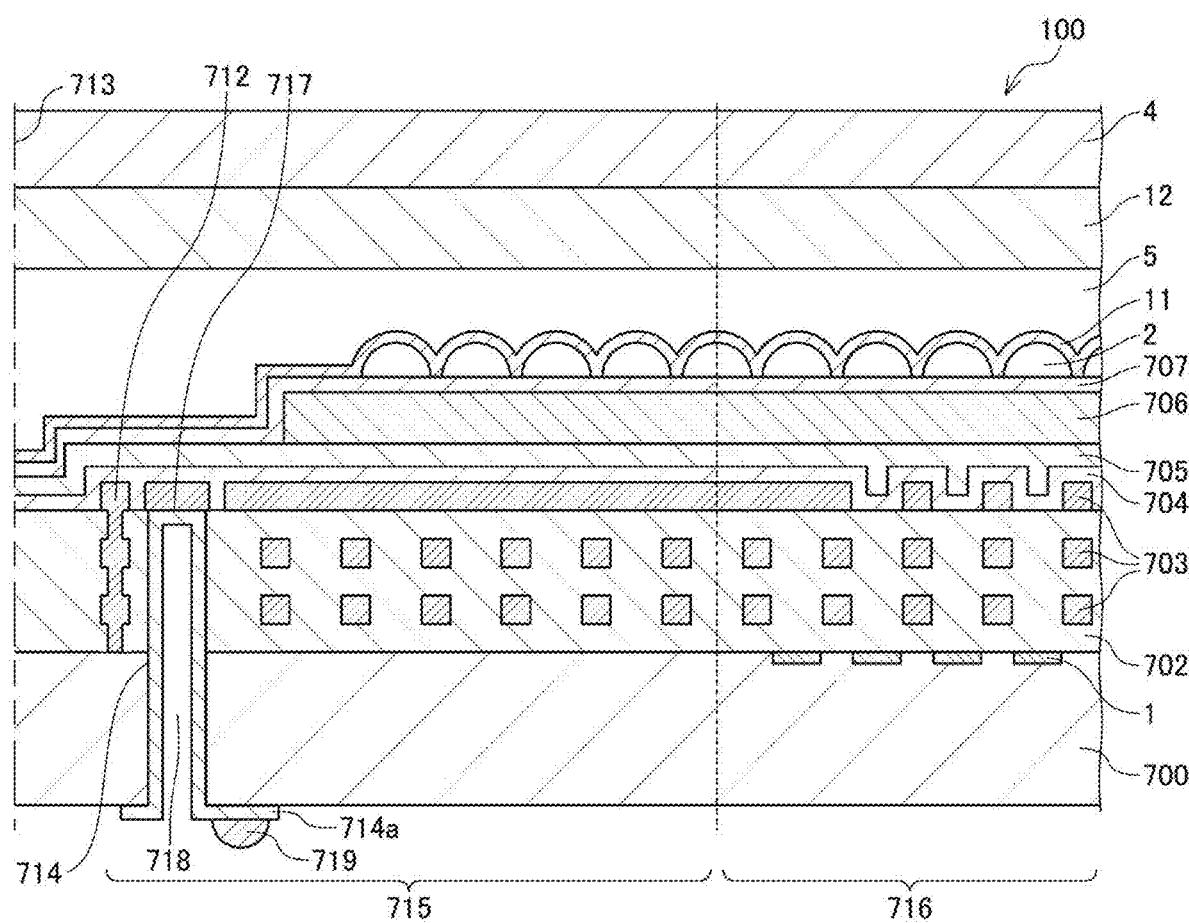
FIG. 6 is an example of a sectional view showing a configuration of a photoelectric conversion device.

FIG. 6 is another example of a sectional view showing a configuration of the photoelectric conversion device 100.

Another sectional structure of the photoelectric conversion device 100 will be described with reference to FIG. 6. FIG. 6 shows a cross section that passes through an electrode 714. The sectional view shown in FIG. 6 focuses on an area from a part of a pixel region 716 to outside of the photoelectric conversion device 100 over a side surface 713 of the photoelectric conversion device 100. While a single side surface 713 of the photoelectric conversion device 100 is illustrated in FIG. 6, the photoelectric conversion device 100 may have similar sectional structures with respect to other side surfaces.

As shown in FIG. 6, a through-hole 718 is formed in a semiconductor layer 700 and an insulating layer 702. One end of the through-hole 718 reaches a portion 717 of a wiring layer 703. The photoelectric conversion device 100 further has the electrode 714 which passes through the through-hole 718. A portion of the electrode 714 is in contact with and bonded to the portion 717 of the wiring layer 703, and another portion 714a of the electrode 714 extends parallel to a lower surface (in other words, a surface on an opposite side to the light-transmitting plate 4) of the semiconductor layer 700. A solder bump 719 for soldering and bonding the photoelectric conversion device 100 to a mounting substrate is provided in the portion 714a of the electrode 714.

The functional film 5 is arranged between the microlens array 2 and the light-transmitting plate 4. Alternatively, the binding member 12 may be arranged between a photoelectric conversion substrate constituted from the semiconductor layer 700 to the microlens array 2 and the light-transmitting plate 4 and may bond the photoelectric conversion substrate and the light-transmitting plate 4 to each other. An antireflection layer (not illustrated) may be arranged as necessary between the functional film 5 and the binding member 12. In addition, the antireflection layer 11 may be arranged as necessary between the functional film 5 and the microlens array 2. Furthermore, in FIG. 6, reference numeral 1 denotes a photoelectric conversion portion, 704 denotes a passivation member, 705 denotes a planarizing layer that is, for example, a resin layer formed of a resin, 706 denotes a color filter layer, 707 denotes a planarizing layer that is, for example, a resin layer formed of a resin, 712 denotes a moisture-proof ring, and 715 denotes a peripheral region.

In the photoelectric conversion device 100, light incident from the outside passes through the light-transmitting plate 4 and the functional film 5, condensed by a microlens, and is incident to the photoelectric conversion portion 1 to be converted into an electrical signal.

A refractive index of the functional film 5 must be lower than a refractive index of the microlenses constituting the microlens array 2. From this perspective, the functional film 5 can be referred to as a low-refractive index film.

The refractive index of the functional film 5 that is suitable as a low-refractive index film is within a range from 1.05 to 1.15.

In addition, the refractive index of the functional film 5 is preferably within a range from 1.05 to 1.14, more preferably within a range from 1.05 to 1.13, even more preferably within a range from 1.05 to 1.12, particularly preferably within a range from 1.05 to 1.11, and especially preferably within a range from 1.05 to 1.10.

Since the refractive index of air is 1.00, it is impossible to set the refractive index lower than 1.00. Furthermore, in order to improve the condensing property of a microlens, a difference in refractive indexes between the functional film 5 and the microlens is preferably increased.

When the refractive index of the functional film 5 exceeds 1.15, for example, using a microlens with a resin composition of which the refractive index is within a range from 1.50 to 1.60 reduces the difference in refractive indexes between the functional film 5 and the microlens and results in lowering of the condensing property of the microlens.

From the perspective of light transmitted through the functional film 5, when an average transmittance of light in a wavelength region of 400 nm to 700 nm (hereinafter, also referred to as a transmittance) is 90.0% or higher, the functional film 5 can be referred to as a light-transmitting film. In the photoelectric conversion device, the average transmittance of light in a wavelength region of 400 nm to 700 nm through the functional film 5 suitable as a light-transmitting film is 98.5% or higher.

In addition, the transmittance is preferably 99.0% or higher, more preferably 99.2% or higher, and even more preferably 99.4% or higher. Meanwhile, the transmittance is preferably 100.0% or lower, and more preferably 99.9% or lower.

It should be noted that the numerical value ranges described above can be arbitrarily combined with each other.

Unless otherwise noted, the transmittance refers to a transmittance of parallel transmitted light and does not include a transmittance of diffused transmitted light.

When the transmittance of the functional film is 98.5% or higher, performance of the photoelectric conversion device improves.

The film thickness of the functional film 5 is within a range from 500 nm to 5000 nm.

In addition, the film thickness of the functional film 5 is preferably within a range from 800 nm to 5000 nm, more preferably within a range from 1000 nm to 5000 nm, even more preferably within a range from 1200 nm to 5000 nm, and particularly preferably within a range from 1500 nm to 5000 nm. Furthermore, the film thickness of the functional film 5 may be 2000 nm or less. For example, the film thickness of the functional film 5 may within a range from 500 nm to 2000 nm, 800 nm to 2000 nm, 1000 nm to 2000 nm, 1200 nm to 2000 nm, 1500 nm to 2000 nm, or the like.

While the functional film 5 is arranged so as to completely cover the microlens array, when the film thickness of the functional film 5 is less than 500 nm, it is difficult to completely cover the microlenses and a vertex of a microlens may end up being exposed from the functional film 5.

On the contrary, when the film thickness of the functional film 5 exceeds 5000 nm, cracks are likely to occur when forming the functional film 5 and the transmittance may decrease.

When the functional film 5 is arranged so as to completely cover the microlens array, the film thickness of the functional film 5 refers to a thickness from a vertex of the microlenses to an upper surface of the functional film 5 (in FIG. 1, a contact surface between the light-transmitting plate 4 and the functional film 5).

A surface of the film on a side of the light-transmitting plate is preferably flatter than a surface of the film on a side of the microlens array. In other words, the surface of the functional film 5 on a side of the light-transmitting plate 4 is preferably flatter than the surface of the functional film 5 on a side of the microlens array 2 (hereinafter, also simply referred to as a "lower surface").

In this case, the lower surface of the functional film 5 refers to an irregular surface of the functional film 5 having irregularities in accordance with the irregularities of the microlens array 2. In other words, preferably, irregularities of the upper surface of the functional film 5 along the light-transmitting plate 4 are flatter than irregularities of the lower surface of the functional film 5. From this perspective, the functional film 5 can be referred to as a planarizing film which planarizes the irregularities of the microlens array 2.

When the functional film 5 is used as a planarizing film in this manner, the film thickness of the functional film 5 is preferably twice a difference in height of the irregularities of the microlens array 2 or more and more preferably three times the difference in height or more. The film thickness of the functional film 5 may be five times the difference in height of the irregularities of the microlens array 2 or less.

In addition, the upper surface of the functional film 5 is also preferably flat. When the upper surface of the functional film 5 is flat, scattering of light by the irregularities is suppressed and a transmittance of the functional film 5 is further improved. Furthermore, the possibility of reduction in performance of the photoelectric conversion device due to a space being formed at an interface between the light-transmitting plate 4 and the functional film 5 and moisture penetrating into the functional film 5 through the space to cause a change in the refractive index or the transmittance of the functional film 5 can be reduced.

In this case, being flat means that a difference between a maximum value and a minimum value of a thickness from an upper surface of the photoelectric conversion portion 1 to the upper surface of the functional film 5 (in FIG. 1, a thickness from a contact surface between a base material provided with the photoelectric conversion portion 1 and the microlens array 2 to a contact surface between the light-transmitting plate 4 and the functional film 5) is 100 nm or less. In other words, being flat means that a difference in height of the upper surface of the functional film 5 is 100 nm or less.

The refractive index of the microlens array 2 is within a range from, for example, 1.40 to 2.10, preferably from 1.45 to 1.80, and more preferably from 1.50 to 1.75.

When the refractive index of the microlens array 2 is within the ranges described above, an appropriate difference in refractive indexes exists between the functional film 5 and the microlens array 2 and the condensing property of the microlens array is further improved.

A material of the microlens array is preferably a transparent material, more preferably a colorless and transparent material.

As the material of the microlens array, an inorganic substance such as silicon oxide, titanium oxide, niobium oxide, zirconium oxide, tantalum oxide, silicon nitride, and silicon oxynitride can be used.

However, since forming a uniform microlens array with good reproducibility using an inorganic material requires a high level of skill, there is a possibility that cost may soar.

In consideration thereof, the microlens array preferably contains a resin material.

Specific examples of the resin material include resin materials such as acrylic-based resins, epoxy-based resins, polyimide-based resins, and styrene-based resins.

In addition, the resin material may contain fine particles with a high refractive index.

The functional film 5 preferably contains a solid substance with a refractive index within a range from 1.10 to 1.65, a solid substance with a refractive index within a range from 1.20 to 1.65 or from 1.20 to 1.60, a solid substance with a refractive index within a range from 1.25 to 1.65 or from 1.25 to 1.60, a solid substance with a refractive index within a range from 1.30 to 1.65 or from 1.30 to 1.60, or a solid substance with a refractive index within a range from 1.35 to 1.60.

Solid substances with an individual refractive index of lower than 1.10 hardly exist.

In addition, when a solid substance with a refractive index of 1.65 or lower is used as a skeleton, porosity can be appropriately set for the purpose of refractive index reduction and strength of the functional film 5 can be increased.

The solid substance may be either a crystalline substance or a non-crystalline substance. The solid substance may be a particle. The particle is not particularly limited and examples of the particle include a spherical particle, an amorphous particle, particle in which the spherical particles or the amorphous particles are connected in a bead or branched-chain shape, a hollow particle having an internal cavity, and a particle in which hollow particles are connected in a bead or branched-chain shape.

Examples of a material of the solid substance are as follows.

A resin such as a fluorine-based polymer or an acrylic resin, a fluoride such as magnesium fluoride or calcium fluoride, a carbonate such as calcium carbonate or potassium carbonate, a sulfate such as barium sulfate, and an oxide such as silicon dioxide (hereinafter, also referred to as silica) or aluminum oxide.

Examples of the solid substance that is a low-refractive index material include organic materials such as a fluorine-based polymer and inorganic materials such as magnesium fluoride and silicon dioxide.

However, a refractive index of a fluorine-based polymer with a low refractive index is around 1.30 and refractive indexes of magnesium fluoride and silicon dioxide (quartz) are respectively 1.38 and 1.46, and materials of which an individual refractive index is significantly lower than 1.30 are mainly gases such as nitrogen and oxygen.

Among the solid substances described above, silicon dioxide is preferable from the perspectives of a refractive index, cost, and chemical stability.

In other words, a main component of the solid substance is preferably silicon dioxide. In this case, "a main component of the solid substance is silicon dioxide" means that, in the solid substance, silicon dioxide accounts for 50% by mass or more. Typically, silicon dioxide accounts for 90% by mass or more in the solid substance.

Specific examples of silicon dioxide particles include SNOWTEX series and ORGANOSILICASOL manufactured by Nissan Chemical Industries, Ltd., THRULYA series manufactured by JGC Catalysts and Chemicals Ltd., AEROSIL series manufactured by Evonik Industries AG and marketed by NIPPON AEROSIL CO., LTD.

Generally, a refractive index $n_c$ of a complex substance C constituted by a substance A with a refractive index of $n_a$ and a substance B with a refractive index of $n_b$ is approximately represented by expression (1) below.

$$n_c = [n_a \times v_a/100] + [n_b \times v_b/100] \tag{1}$$

where $v_a$ and $v_b$ respectively denote volume fractions of the substance A and the substance B constituting the complex substance ($v_a + v_b = 100$).

According to expression (1), using a complex substance of a solid substance and air or, in other words, a porous film having a solid substance as a skeleton as the functional film 5 enables the refractive index of the functional film 5 to be lower than a refractive index of the original solid substance. In this case, the lower the refractive index of the solid substance to be used as a skeleton and the higher the porosity of the functional film 5, the lower the refractive index of the functional film 5. In order to increase the porosity of the functional film 5, the functional film 5 may have a porous structure. From this perspective, the functional film 5 can be referred to as a porous film.

In expression (1) provided above, when it is assumed that the substance A is air and the substance B is silicon dioxide, the refractive index of air is $n_a = 1.00$, the refractive index of silicon dioxide is $n_b = 1.46$, and the volume fraction of silicon dioxide is $v_b = 100 - v_a$. In other words, $v_a$ becomes a function of the refractive index $n_c$ of the functional film 5 and, accordingly, $v_a$ can be obtained. In this case, $v_a$ represents porosity.

The porosity of the functional film 5 is preferably within a range from 60.0% to 95.0% and more preferably within a range from 65.0% to 90.0%.

For example, according to expression (1), when the porosity of the functional film 5 having silicon dioxide (refractive index of 1.46) as a skeleton is lower than 60.0%, the refractive index may exceed 1.15.

Meanwhile, when the porosity exceeds 95.0%, there is a possibility that the refractive index of the functional film 5 may become an excessively low refractive index of lower than 1.05 and, at the same time, the strength of the functional film 5 may decrease due to a deficiency of the skeleton constituting the functional film 5.

While a case where the functional film 5 contains a hollow particle will be further described, the functional film 5 is not limited thereto. A hollow particle refers to a particle of which an outer shell is formed of a solid substance and which has a cavity inside the outer shell.

The functional film 5 preferably contains a plurality of hollow particles. Each of the plurality of hollow particles is a particle which has an outer shell constituted by a solid substance and in which the outer shell encloses a pore. The functional film 5 containing the plurality of hollow particles may contain solid particles or a binder in addition to the hollow particles.

Figure 8:
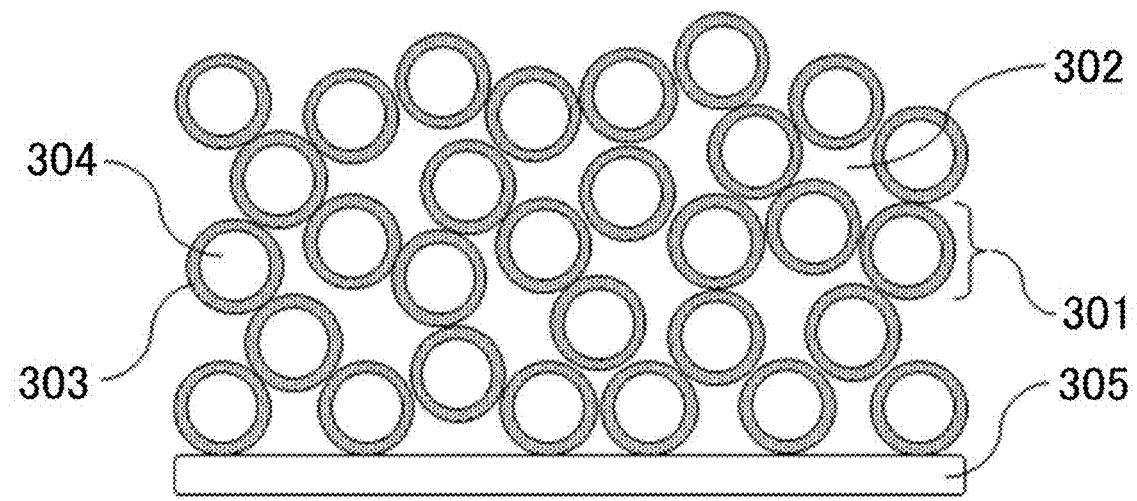
FIG. 8 is a diagram showing a structure of a film.

FIG. 8 shows an example of a structure of the functional film 5 containing hollow particles as primary particles constituted by a solid substance.

The functional film 5 contains a hollow particle 301 in plurality and a pore 302 between hollow particles exists between the plurality of hollow particles 301. In addition, a pore 304 also exists inside the hollow particle. In FIG. 8, reference numeral 303 denotes an outer shell and reference numeral 305 denotes a base material.

Assuming that a ratio of a total volume of pores inside the plurality of hollow particles relative to a unit volume of the functional film 5 is taken as a porosity X (%) and a ratio of a total volume of pores between the hollow particles relative to the unit volume of the functional film 5 is taken as a porosity Y (%), a relationship expressed as X<Y is preferably satisfied.

In this case, (X+Y) represents the porosity of the functional film 5 described above.

In addition, a refractive index n of the functional film 5 is represented by expression (2) below.

$$n = [n_a \times (X+Y)/100] + [n_s \times (100-X-Y)/100] \tag{2}$$

where $n_a$ denotes the refractive index of air ($n_a=1$) and $n_s$ denotes the refractive index of the outer shell of the hollow particle ($n_s > 1$). According to the expression (2), the larger a value of X+Y and the lower a value of $n_s$, the lower a value of n.

In addition, the refractive index n of the functional film 5 is also represented by expression (3) below.

$$n = [n_a \times Y/100] + [n_p \times (100-Y)/100] \tag{3}$$

where $n_p$ denotes a refractive index of one hollow particle ($n_p > 1$). The refractive index $n_p$ is an apparent refractive index that is calculated from ratios of a volume and a refractive index of an outer shell relative to a volume and a refractive index of a pore in a single hollow particle. In other words, when $n_a=1$, $n_b=n_s$, $v_a$ denotes a volume of a pore of a hollow particle, and $v_b$ denotes a volume of an outer shell in expression (1), $n_c = n_p$ is satisfied.

According to the expression (3), the larger a value Y and the lower a value of $n_p$, the lower the value of n.

It should be noted that X and Y can also be estimated by obtaining the refractive index n of the functional film 5 by optical measurement and assigning known values of $n_a$, $n_s$, and $n_p$ into expressions (2) and (3).

Figure 9:
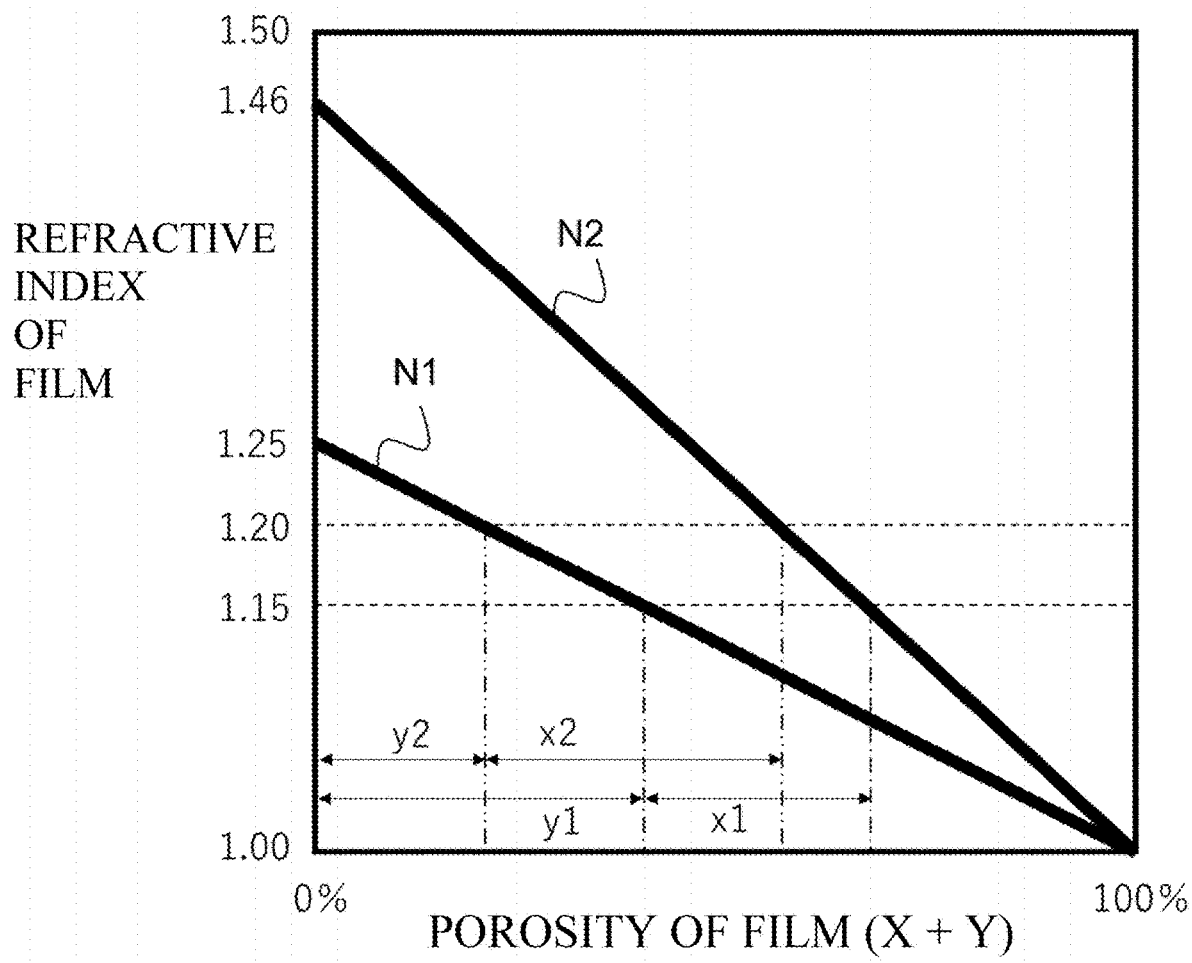
FIG. 9 is a diagram illustrating relationships among a refractive index n of a film, X, Y, and X+Y.

FIG. 9 shows an example of a relationship among the refractive index n of the functional film 5 containing a hollow particle, the porosity X (hereinafter, also simply referred to as X), and the porosity Y (hereinafter, also simply referred to as Y).

When the functional film 5 is solely constituted by solid particles with a refractive index of 1.25 and/or pores, N1 in FIG. 9 conceivably represents a relationship between a porosity among the solid particles of the functional film 5 and the refractive index n of the functional film 5. Assuming that a hollow particle has an outer shell with a refractive index $n_s$=1.46 and a pore inside the hollow particle has a prescribed volume, a refractive index $n_p$ of a single hollow particle is 1.25. In this case, N1 also represents a relationship between the porosity among hollow particles and the refractive index n of the functional film 5 when the functional film 5 is solely constituted by hollow particles which have an outer shell with a refractive index $n_s$=1.46 and a single hollow particle has a refractive index $n_p$=1.25 and/or pores between the hollow particles. In addition, when the functional film 5 is solely constituted by a solid substance (for example, solid particles) with a refractive index of 1.46 and/or pores, N2 represents a relationship between a porosity among the solid particles of the functional film 5 and the refractive index n of the functional film 5. The configuration described above is merely an example for explaining a relationship among n, X, and Y and is not intended to limit the present disclosure in any way whatsoever.

The relationship N1 in FIG. 9 indicates that, when obtaining a functional film with a refractive index of 1.20 using solid particles with a refractive index of 1.25, a porosity among the solid particles is y2. In addition, the relationship N1 indicates that, when obtaining a functional film with a refractive index of 1.15 using solid particles with a refractive index of 1.25, a porosity among the solid particles is y1. Furthermore, FIG. 9 shows that, when obtaining a functional film with a refractive index of 1.20 using a solid substance (for example, solid particles) with a refractive index of 1.46, a porosity is x2+y2. Moreover, FIG. 9 shows that, when obtaining a functional film with a refractive index of 1.15 using a solid substance (for example, solid particles) with a refractive index of 1.46, a porosity is x1+y1.

In this case, when obtaining a functional film with a refractive index of 1.20 by replacing the solid particles with a refractive index of 1.25 with conceivably-equivalent hollow particles of which a single particle has a refractive index $n_p$=1.25, a total volume of pores in the hollow particles can be estimated as (x2+y2)−y2=x2. In a similar manner, when obtaining a functional film with a refractive index of 1.15 by replacing the solid particles with a refractive index of 1.25 with conceivably-equivalent hollow particles of which a single particle has a refractive index $n_p$=1.25, a total volume of pores in the hollow particles can be estimated as (x1+y1)−y1=x1.

In FIG. 9, when the refractive index of a functional film containing hollow particles of which a single particle has a refractive index $n_p$=1.25 is 1.20, x2>y2 is satisfied. In contrast, when the refractive index of a functional film containing hollow particles of which a single particle has a refractive index $n_p$=1.25 is 1.15, x1<y1 is satisfied. It will be appreciated that adopting x1<y1 (X<Y) instead of x2>y2 (X>Y) in this manner lowers the refractive index of the functional film.

According to FIG. 9, for example, when setting the refractive index n of the functional film 5 to 1.20, while a porosity of y2(%) is sufficient in a case where the functional film 5 is solely constituted by the hollow particles, a porosity of y2+x2(%) is required in a case where the functional film 5 is solely constituted by the solid particles. In other words, in this case, a difference x2 between y2+x2(%) and y2(%) is the porosity X and y2 is the porosity Y described earlier.

In addition, according to FIG. 9, it will be appreciated that Y decreases as X increases and, as a result, a value of X+Y decreases while n increases. This means that, when hollow particles are densely arranged, since the volume fraction of pores existing between the hollow particles decreases while the volume fraction of outers shells which are components having a higher refractive index than air increases, the refractive index of the functional film 5 increases.

Meanwhile, as is apparent from a comparison between y2+x2 and y1+x1 in FIG. 9, Y increases as X decreases and, as a result, a value of X+Y increases while n decreases. This means that, when hollow particles are sparsely arranged, since the volume fraction of pores existing between the hollow particles increases while the volume fraction of outers shells decreases, the refractive index of the functional film 5 decreases.

In other words, Y/X may be increased in order to further lower the refractive index of the functional film 5.

Specifically, a relationship expressed as Y/X>1 or X<Y is preferably satisfied.

In addition, X and Y preferably satisfy a relationship expressed as X<(100−X−Y)<Y.

The functional film 5 may contain particles constituted by a solid substance and a binder for binding the particles in order to increase strength.

When using a binder, solids contained in the functional film 5 is the outer shell of the hollow particles and the binder, and the volume fraction of the solids relative to the unit volume of the functional film 5 is represented by (100−X−Y) (%).

When a relationship expressed as X<(100−X−Y) is satisfied, the strength of the functional film 5 is further improved. Meanwhile, when a relationship expressed as (100−X−Y)<Y is satisfied, the refractive index of the functional film 5 is further lowered.

The total value (X+Y) of X and Y is preferably within a range from 60.0% to 95.0% and more preferably within a range from 65.0% to 90.0%. Setting (X+Y) within these ranges enables the strength of the functional film 5 and the refractive index of the functional film 5 to be readily adjusted to desired ranges.

In the functional film 5, X is preferably within a range from 8.0% to 32.0%, more preferably within a range from 10.0% to 28.0%, and even more preferably within a range from 12.0% to 24.0%.

Meanwhile, Y is preferably within a range from 30.0% to 80.0%, more preferably within a range from 35.0% to 75.0%, and even more preferably within a range from 40.0% to 70.0%.

Setting X and Y within these ranges enables the strength of the functional film 5 and the refractive index of the functional film 5 to be readily adjusted to desired ranges.

While the hollow particles in the illustration of FIG. 8 have a substantially spherical shape, the hollow particles are not limited thereto. The hollow particle has the outer shell 303 and the pore 304 which is enclosed by the outer shell and which is formed inside the hollow particle. In this case, the hollow particle can be considered a type of a core-shell particle having air as its core.

The refractive index $n_p$ of one hollow particle is represented by expression (4).

$$n_p = [n_s \times (100 - V_a)/100] + [n_a \times V_a/100] \quad (4),$$

where $V_a$ denotes a volume fraction of an internal pore relative to a total volume of a hollow particle. In other words, the refractive index $n_p$ of one hollow particle is determined by the refractive index $n_s$ of a material of the outer shell and a porosity $V_a$ of one hollow particle.

The porosity $n_p$ of one hollow particle is preferably within a range from 30.0% to 70.0% and more preferably within a range from 35.0% to 65.0%.

When the porosity $n_p$ is within the ranges described above, the refractive index of the functional film 5 can be readily lowered and the strength of the outer shell of the hollow particle and the strength of the functional film 5 can be stabilized.

In a similar manner to the refractive index of the solid substance described above, the refractive index of the outer shell $n_s$ of the hollow particle is preferably 1.10 or higher, 1.20 or higher, 1.25 or higher, 1.30 or higher, or 1.35 or higher. In a similar manner to the refractive index of the solid substance described above, the refractive index of the outer shell $n_s$ of the hollow particle is preferably 1.65 or lower, or 1.60 or lower. The numerical value ranges described above can be arbitrarily combined with each other.

When the refractive index $n_s$ of the outer shell of the hollow particle is within the ranges described above, easiness of manufacturing the functional film 5, the strength of the hollow particle, and the strength of the functional film 5 are superior and, at the same time, the refractive index of the functional film 5 can be adjusted to a low level.

Materials similar to that of the solid substance described earlier can be used as a material of the outer shell of the hollow particle.

In addition, the outer shell of the hollow particle may have microscopic holes. Forming microscopic holes in the outer shell enables the refractive index of the outer shell to be further lowered.

A number-average particle diameter of a primary particle of the hollow particle is preferably within a range from 1 nm to 200 nm, more preferably within a range from 5 nm to 100 nm, even more preferably within a range from 10 nm to 100 nm, and particularly preferably within a range from 20 nm to 100 nm.

When the number-average particle diameter is within the ranges described above, the hollow particle can be readily fabricated, scattering of light can be readily suppressed, and the transmittance of the functional film 5 can be further improved.

The functional film 5 preferably contains at least one particle selected from the group consisting of a secondary particle in which primary particles constituted by a solid substance form a three-dimensional structure, a chain-like secondary particle in which primary particles constituted by a solid substance are connected to each other in a chain shape, and a branched chain-like secondary particle in which primary particles constituted by a solid substance are connected to each other in a branched-chain shape. In this case, when particles constituted by a solid substance form an agglomerate, the agglomerate is also included in a secondary particle in which primary particles constituted by the solid substance form a three-dimensional structure.

The secondary particle in which primary particles constituted by a solid substance form a three-dimensional structure, the chain-like secondary particle in which primary particles constituted by a solid substance are connected to each other in a chain shape, and the branched chain-like secondary particle in which primary particles constituted by a solid substance are connected to each other in a branched-chain shape are capable of reducing the volume fraction of the solid substance contained in the functional film 5 and increasing the volume fraction of pores. In other words, the refractive index of the functional film 5 can be lowered.

A number-average particle diameter of a primary particle constituted by the solid substance is preferably within a range from 1 nm to 200 nm, more preferably within a range from 5 nm to 100 nm, even more preferably within a range from 10 nm to 100 nm, and particularly preferably within a range from 20 nm to 100 nm.

When the number-average particle diameter of the primary particle is within the ranges described above, agglomeration of particles can be appropriately controlled and dispersibility into a coating liquid can be improved. In addition, the primary particle can be prevented from becoming a scatterer of light in a wavelength region of 400 nm to 700 nm and the transmittance of the functional film 5 can be further improved.

While an example will be described in which a fumed silica particle is used as an example of a secondary particle in which primary particles constituted by a solid substance form a three-dimensional structure, secondary particles are not limited thereto.

A fumed silica particle can be produced by high-temperature hydrolysis of silicon tetrachloride in an oxygen and hydrogen flame.

In a fumed silica particle created by the manufacturing process described above, primary particles of several ten nanometers melt and adhere to each other to form a secondary particle with a three-dimensional structure. In addition, the secondary particles may agglomerate and acquire a complex higher-order structure.

Due to its characteristic structure, the fumed silica particle is an extremely bulky particle with an apparent specific gravity within a range from 0.01 g/cm$^3$ to 0.1 g/cm$^3$. Therefore, the functional film 5 containing the fumed silica particle has a high porosity and the refractive index of the functional film can be significantly lowered.

A number-average particle diameter of the secondary particle is preferably within a range from 10 nm to 1000 nm and more preferably within a range from 50 nm to 500 nm.

When the number-average particle diameter of the secondary particle is within the ranges described above, for example, primary particles of silicon dioxide form a three-dimensional structure and the secondary particle do not acquire a simple structure in which several primary particles are aggregated.

Due to the secondary particle having the structure described above, the porosity of the functional film 5 can be readily controlled in the ranges described above and the refractive index of the functional film 5 can be readily controlled in the ranges described above. In addition, since a giant pore that may potentially become a scatterer of light in the 400 nm to 700 nm wavelength region is less likely to be formed in interparticle gaps of the secondary particles, transmittance of light of the functional film 5 can be readily controlled in the ranges described above.

The number-average particle diameters of the primary particle and the secondary particle can be measured using a transmission electron microscope (TEM) (both number-average particle diameters are calculated from an arithmetic mean value of a maximum diameter). In addition, the number-average particle diameters of the primary particle and the secondary particle can be controlled by adjusting, for example, conditions applied when performing high-temperature hydrolysis of silicon tetrachloride in an oxygen and hydrogen flame as described earlier.

Silicon dioxide preferably has at least one of an organic group and a hydroxy group on a surface thereof.

Since silicon dioxide with an exposed hydroxy group has high hydrophilicity, using particles of such silicon dioxide as a skeleton enables the functional film 5 with high hydrophilicity to be formed.

In addition, for example, functionality can be imparted to the functional film 5 by modifying the surface of the silicon dioxide with a silane coupling member. When a hydroxy group is exposed on the surface of the silicon dioxide, a dehydration condensation reaction between the hydroxy group and a hydrolysis product of the silane coupling member can be utilized.

Examples of the organic group include: an acrylic group with 1 to 4 carbons such as a methyl group, an ethyl group, a propyl group, or a butyl group; a hydrocarbon group having a polymerizable part such as a vinyl group, an acrylic group, or a methacrylic group; and an aromatic hydrocarbon group such as a phenyl group. However, organic groups are not limited to these examples.

When an organic group exists on the surface of the silicon dioxide, various functions such as water repellency, an oleophobic property, a biological compatibility, an electron transportability, and polymerizability can be imparted to the functional film 5.

In addition, functional groups exposed on the surface of the silicon dioxide need not all be substituted with an organic group and both organic groups and hydroxy groups may be exposed at an arbitrary ratio.

A film strength of the functional film 5 is measured using a SAICAS (surface and interfacial cutting analysis system) method, and indicates a value of a horizontal force at a cutting depth of 0.5 μm expressed in units of N/m. A horizontal force refers to a load in a horizontal direction which is applied to a diamond cutting blade when a diagonal cut is made by the cutting blade from a surface of a sample to an interface between a film and a substrate.

The strength of the functional film 5 is preferably within a range from 3.0 N/m to 100.0 N/m.

The strength of the functional film 5 is preferably 5.0 N/m or higher, and more preferably 10.0 N/m or higher. The strength of the functional film 5 is preferably 50.0 N/m or lower, more preferably 30.0 N/m or lower, even more preferably 25.0 N/m or lower, and particularly preferably 21.0 N/m or lower. The numerical value ranges described above can be arbitrarily combined with each other. For example, the strength of the functional film 5 may range from 3.0 N/m to 25.0 N/m.

Setting the strength of the functional film 5 higher than 30.0 N/m significantly lowers the transmittance of the functional film 5 to, for example, lower than 90.0% and makes it difficult for the functional film 5 to realize functions as a light-transmitting film.

The photoelectric conversion device can be manufactured using existing techniques.

For example, a microlens array is arranged on a photoelectric conversion portion. The microlens array may be formed by, after applying an organic material or an inorganic material on the photoelectric conversion portion, performing a photolithography process or an etch-back process. Subsequently, the functional film 5 may be formed on the microlens array.

An example of the manufacturing method of the functional film 5 includes the steps of:
preparing a mixed solution (mixture) containing a solid substance and a solvent;
performing a dispersion process on the mixed solution (mixture) to obtain a coating liquid; and
obtaining a film by performing form formation using the coating liquid and drying the coating liquid.

A preparation method of the coating liquid for forming the functional film 5 will be described.

While an example of using a fumed silica particle in which primary particles of silicon dioxide form a three-dimensional structure will be described, the use of a fumed silica particle is not restrictive.

The fumed silica particle is dispersed in a solvent. As the solvent in which the fumed silica particle is dispersed, a solvent with a high affinity with the fumed silica particle is preferable and, depending on a type of a functional group on the surface of the fumed silica particle, a single-type solvent or a mixed solvent of two or more types may be used.

An organic solvent is preferable as the solvent, and examples of an organic solvent that can be used include: an alcohol-based solvent such as methanol, ethanol, propanol, or isopropanol; a glycol-based solvent such as ethylene glycol or propylene glycol; an ether-based solvent such as dimethyl ether, diethyl ether, ethylene glycol monomethyl ether, ethylene glycol monoethyl ether, propylene glycol monomethyl ether, or propylene glycol monoethyl ether; an acetate-based solvent such as ethyl acetate, propyl acetate, propylene glycol monomethyl ether acetate, or propylene glycol monoethyl ether acetate; and a ketone-based solvent such as acetone or methyl ethyl ketone.

While water can also be used as the solvent, since water has high surface tension, a large capillary force is generated during drying and pores between the fumed silica particles may contract. Therefore, the porosity of the functional film 5 is likely to decrease and the refractive index may increase.

As for particles constituted by the solid substance, one type may be used independently or two or more types may be used in a combined manner.

A content of particles constituted by the solid substance in the coating liquid is preferably 1.00% by mass or more, more preferably 2.00% by mass or more, even more preferably 3.00% by mass or more, and particularly preferably 7.00% by mass or more. A content of silica particles in the coating liquid is preferably 50.00% by mass or less, more preferably 30.00% by mass or less, and even more preferably 20.00% by mass or less. The numerical value ranges described above can be arbitrarily combined with each other.

For example, a concentration (a solid content concentration) of fumed silica particles in the coating liquid is preferably within a range from 1.00% by mass to 30.00% by mass and more preferably within a range from 2.00% by mass to 20.00% by mass.

When a content of particles constituted by the solid substance in the coating liquid such as a content (concentration) of the fumed silica particles is within the ranges described above, the film thickness of the functional film 5 can be readily adjusted to 500 nm or more. In addition, uniform dispersibility of the fumed silica particles in the solvent can be improved and the transmittance of the obtained functional film 5 can be readily adjusted to the ranges described above.

After the fumed silica particles are added to the solvent described above, a dispersion process is performed.

When performing film formation using the coating liquid in a state where the fumed silica particles are dispersed in the solution while maintaining a complex high-order structure, since the fumed silica particles and the pores between the fumed silica particles acquire sizes which scatter visible light, the transmittance of the functional film 5 may decrease.

By applying a dispersion process to the fumed silica particles, transparency of the coating liquid increases as dispersion process time elapses.

When performing film formation using the coating liquid in which the fumed silica particles have been suitably dispersed, since a skeleton of the fumed silica particles and the pores between the fumed silica particles acquire sizes which do not act as scatterers of visible light, the functional film 5 with high transmittance is formed.

Further applying the dispersion process increases the likelihood of the bulky high-order structure of the fumed silica particles being destroyed down to primary particles and may cause lowering in the porosity and, consequently, the refractive index of the obtained functional film 5 tends to rise.

In addition, an excessive dispersion process creates a so-called excessively-dispersed state in which the fumed silica particles are likely to re-agglomerate, and the transmittance of the functional film 5 after film formation may decrease.

Therefore, a suitably-dispersed state is preferably created. For the dispersion process, a stirrer, ultrasonic waves, a rotating and revolving mixer, a ball mill, a bead mill, a homogenizer, or the like can be used.

While an example of using a hollow particle of which an outer shell is silicon dioxide as a solid substance will be described, the use of the hollow particle is not restrictive.

A hollow particle dispersion can be used. The hollow particle dispersion is not particularly limited as long as the hollow particle dispersion satisfies the porosity of the hollow particles, the refractive index of the outer shell of the hollow particles, the number-average particle diameter of primary particles of the hollow particles, and the like described earlier.

For example, the THRULYA series manufactured by JGC Catalysts and Chemicals Ltd. which is an isopropanol (hereinafter, also referred to as IPA) dispersion of hollow particles (hereinafter, also referred to as hollow silica particles) of which an outer shell is silicon dioxide is favorably used. In addition to commercial products such as the THRULYA series, hollow particles dispersed in a solvent by a similar method to the solvent dispersion of the fumed silica particles described above may be used as long as the hollow particles are hollow silica particles.

Concentration of the hollow particles in the solvent may be set to a range similar to the concentration (solid content concentration) of the fumed silica particles in the coating liquid described above.

Since a surface of the hollow silica particles is hydrophilic with an exposed hydroxy group, a solvent with strong hydrophobicity is not suitable. Specifically, the following solvents with an octanol-water partition coefficient log $P_{ow}$ of 2 or less are preferable.

An organic solvent, examples of which include: an alcohol-based solvent such as methanol, ethanol, propanol, or isopropanol; a glycol-based solvent such as ethylene glycol or propylene glycol; an ether-based solvent such as dimethyl ether, diethyl ether, ethylene glycol monomethyl ether, ethylene glycol monoethyl ether, propylene glycol monomethyl ether, or propylene glycol monoethyl ether; an acetate-based solvent such as ethyl acetate, propyl acetate, propylene glycol monomethyl ether acetate, or propylene glycol monoethyl ether acetate; and a ketone-based solvent such as acetone or methyl ethyl ketone.

A relationship between an agglomeration state of hollow particles and a structure of a film will be described with reference to FIGS. 11A to 11F.

When a dispersion (FIG. 11A) of hollow silica particles 310 which are not agglomerated and which are preferably dispersed is applied on a substrate, the hollow silica particles 310 are arranged relatively densely (FIG. 11B) and Y and X+Y decrease. However, since a hollow silica particle itself which is constituted by an outer shell of silica that is a low-refractive index material and a pore enclosed by the outer shell has a low refractive index, a low refractive index can be maintained even in a case where the functional film 5 has a densely arranged structure. Nevertheless, a further reduction in the refractive index of the film is required in order to improve a condensing property of a microlens in a photoelectric conversion device.

As described earlier, in order to lower the refractive index of the film, Y and X+Y must be increased. One method of increasing Y and X+Y involves randomly arranging the hollow silica particles.

A method of randomly arranging hollow silica particles will now be described.

Figure 11A:
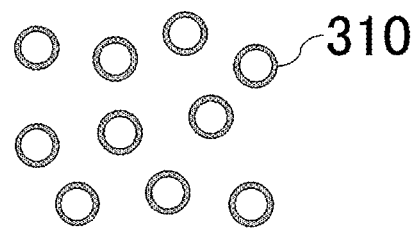
FIG. 11A is a diagram illustrating a state of agglomeration of hollow particles.
Figure 11B:
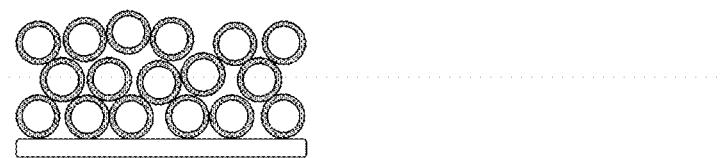
FIG. 11B is a diagram showing a structure of a film.
Figure 11C:
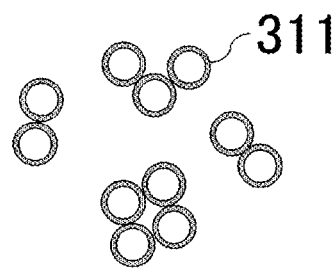
FIG. 11C is a diagram illustrating a state of agglomeration of hollow particles.
Figure 11D:
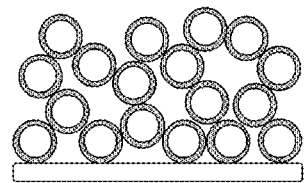
FIG. 11D is a diagram showing a structure of a film.

By forming a mild agglomerate 311 of hollow silica particles in a dispersion (FIG. 11C), the hollow silica particles can be randomly arranged (FIG. 11D).

The agglomerate is also included in secondary particles in which primary particles constituted by a solid substance form a three-dimensional structure.

An example of a method of agglomerating hollow silica particles favorably dispersed in a dispersion involves adding a solvent (hereinafter, a flocculant) with a relatively higher log $P_{ow}$ than a dispersion medium. A method of agglomerating hollow silica particles is not limited to this method and a method which enables an agglomerated state of the hollow silica particles to be controlled is preferable.

Since the hollow silica particles have a hydrophilic surface on which a hydroxy group is exposed, adding a flocculant with a larger log $P_{ow}$ than the dispersion medium or, in other words, a flocculant that is relatively more hydrophobic than the dispersion medium triggers an agglomeration of the hollow silica particles.

log $P_{ow}$ and an additive amount with respect to a flocculant for causing hollow silica particles being favorably dispersed in a dispersion to agglomerate will be described.

Figure 11E:
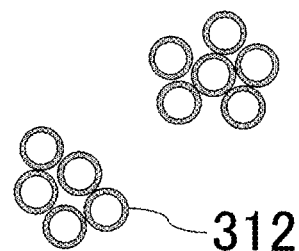
FIG. 11E is a diagram illustrating a state of agglomeration of hollow particles.
Figure 11F:
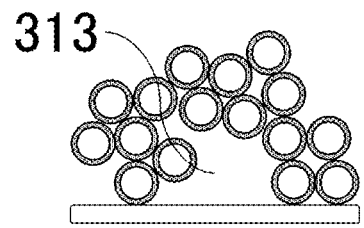
FIG. 11F is a diagram showing a structure of a film.

When a difference in log $P_{ow}$ between the dispersion medium and the flocculant is excessively small, agglomeration of the hollow silica particles does not occur, but when the difference is excessively large, the hollow silica particles agglomerate vigorously even when the additive amount of the flocculant is small (FIG. 11E). When the hollow silica particles form a large agglomerate 312, the agglomerate itself may become a scatterer of light.

Meanwhile, since giant pores 313 formed between the large agglomerates 312 of the hollow silica particles may also readily become scatterers of light, the functional film 5 after application may become turbid and the transmittance of the functional film 5 may decrease.

In addition, when a vigorous agglomeration is induced, preservation stability of the coating liquid tends to decrease. Therefore, in order to form the functional film 5 with a low refractive index and a high transmittance, an agglomeration state of the hollow silica particles may be controlled based on a type and an additive amount of the flocculant. The refractive index of the functional film 5 may be controlled by using such properties to control the agglomeration state of the hollow silica particles based on the type and the additive amount of the flocculant.

Furthermore, since Y and X+Y may decrease and the refractive index of the functional film 5 may increase when the pores between the hollow silica particles are filled by a substance of some kind, the flocculant is preferably removable in a subsequent process and more preferably volatilizes due to heating.

While a silicone oil such as X-22-164 (manufactured by Shin-Etsu Chemical Co., Ltd.), tetraethoxysilane (TEOS), triethoxyvinylsilane (TEVS), and the like can be used as the flocculant, the flocculant is not limited thereto.

Hereinafter, a film formation method of the functional film 5 will be described.

The film is formed by subjecting the coating liquid described above to film formation. As the film formation method, a bar coating method, a doctor blade method, a squeegee method, a spray method, a spin coating method, a dip coating method, a screen printing method, or the like can be used. Among these methods, the spin coating method is preferable from the perspective of making the film thickness of the functional film 5 uniform.

In addition, the transmittance and the film thickness of the functional film 5 are in a reciprocal relationship and, when the transmittance per unit film thickness is constant, the transmittance decreases if the film thickness increases and the transmittance increases if the film thickness decreases.

Therefore, in order to obtain a film which has desired transmittance and film thickness and of which an upper surface is flat, for example, a rotational speed in the spin coating method may be appropriately adjusted.

The film formed by the method described above is preferably dried at 20° C. to 100° C.

The obtained film may be further subjected to a heating process.

The heating process is preferably performed at 100° C. to 300° C. and more preferably at 120° C. to 240° C.

By setting the heating temperature to 100° C. or higher, for example, a possibility that the solvent remains in pores inside the hollow particles can be reduced. Meanwhile, by setting the heating temperature to 240° C. or lower, the microlens array is less likely to soften even when the microlens array is made of resin and a possibility of reduction in performance of the microlens array can be reduced.

In addition, when the film contains a binder and a polymerization initiator, a thermosetting or photosetting step is preferably included. In the case of thermosetting, thermosetting of the binder can be simultaneously performed with volatilization of the solvent in the drying or heating step.

Generally, in a film formed of fine particles, a film shape thereof is maintained by intermolecular force. In addition, while a hydrophobic interaction also acts in a case where a surface of the fine particle is hydrophobic and liquid crosslinking also acts in a case where the surface of the fine particle is hydrophilic, both the hydrophobic interaction and the liquid crosslinking are physical interactions. When the film is subjected to a heating process, for example, since hydroxy groups existing on a surface of fumed silica particles are chemically bound to each other by a dehydration reaction, an increase in film strength can be expected.

When forming a film containing particles constituted by the solid substance described above for the purpose of refractive index reduction, a structure and a shape of the film are maintained by intermolecular forces such as a van der Waals' force and liquid crosslinking which act between particles.

As a method of increasing the strength of a film having the structure described above, a binder that binds the particles together may be used.

From the perspective of increasing strength of the film, the functional film 5 may further contain a binder.

In addition, the functional film 5 preferably contains an aggregation in which the solid substance is bound by a binder. Specifically, the functional film 5 preferably contains an aggregation in which particles constituted by the solid substance are bound by a binder. A bond of the solid substance by the binder is a concept that encompasses all of a bond among primary particles constituted by the solid substance, a bond among secondary particles formed by primary particles constituted by the solid substance, a bond between primary particles and secondary particle, and the like. Alternatively, the bond may be a chemical bond such as an ionic bond or a covalent bond or may be a bond such as a dynamic adhesion.

As the binder, a resin such as an acrylic resin, a fluorine resin, a styrene resin, an imide resin, an urethane resin, or a phenolic resin can be used.

In addition, an organosilicon compound obtained by polymerizing a silicone oil having a polymerizable group or by hydrolyzing and condensation-polymerizing silicon alkoxide can be used.

Any binder other than the above may be used as long as the binder has a low refractive index, the binder is colorless and transparent, and capable of binding particles with each other.

An example of a manufacturing method of a film containing a binder includes the steps of:

preparing a mixed solution (mixture) containing a solid substance, a solvent, and a binder;

obtaining a coating liquid by applying a dispersion process to the mixed solution (mixture); and obtaining a film by performing form formation using the coating liquid and drying the coating liquid and, when necessary, heating the coating liquid or irradiating the coating liquid with a high-energy ray.

The binder preferably contains siloxane and more preferably contains silsesquioxane.

Silsesquioxane is a compound having a T3 unit structure represented by a composition formula $[R^1(SiO_{1.5})_n]$ (where $R^1$ denotes a reactive functional group representing, for example, at least one selected from the group consisting of a polymerizable group, a hydroxy group, a chlorine atom, an alkyl group with 1 to 6 carbons, and an alkoxy group with 1 to 6 carbons) and is a hybrid material of silicon oxide and an organic substance.

Silsesquioxane (hereinafter, also abbreviated as SQ) is a siloxane-based compound of which a main chain skeleton is constituted by a Si—O bond and which is represented by the composition formula $[R^1(SiO_{1.5})_n]$. $R^1$ is preferably at least one polymerizable group selected from the group consisting of an acryloyl group, a methacryloyl group, an oxetanyl group, and an epoxy group.

When silsesquioxane has a role of binding a large number of particles constituted by a solid substance to each other, superior film strength can be realized while having a high porosity.

A polymeric form of silsesquioxane is not particularly limited and examples include known straight-chain silsesquioxane, cage-like polysiloxane, and ladder-like polysiloxane. A silsesquioxane structure refers to a structure in which each silicon atom is bonded to three oxygen atoms and each oxygen atom is bonded to two silicon atoms (the number of oxygen atoms relative to the number of silicon atoms is 1.5). From the perspective of cost, a straight-chain polysiloxane, a cage-like polysiloxane, and a ladder-like polysiloxane may coexist.

Silsesquioxane is preferably a compound which has a polymerizable group (R' in the formula provided above) in a molecule and which is cured by radical polymerization or cationic polymerization.

With respect to silsesquioxane cured by radical polymerization, examples of R include an acryloyl group and a methacryloyl group. Meanwhile, with respect to those cured by cationic polymerization, examples of R include an oxetanyl group and an epoxy group.

Specific examples include silsesquioxane derivative SQ series (AC-SQ, MAC-SQ, and OX-SQ) manufactured by TOAGOSEI CO., LTD.

Since silsesquioxane is a liquid with high viscosity, silsesquioxane may be used added to the coating liquid described above. A polymerization initiator may be added as necessary.

A content of the binder in the functional film relative to 100 parts by mass of a particle constituted by the solid substance is preferably within a range from 3.0 parts by mass to 60.0 parts by mass, more preferably within a range from 7.0 parts by mass to 30.0 parts by mass, even more preferably within a range from 7.0 parts by mass to 25.0 parts by mass, and particularly preferably within a range from 10.0 parts by mass to 25.0 parts by mass.

Silsesquioxane can be cured by applying the coating liquid on a substrate and heating the coating liquid or irradiating the coating liquid with light.

Due to this operation, a film is formed in which the particles constituted by the solid substance contain an aggregation that is bound by silsesquioxane. Curing of silsesquioxane enables strength of the film to be increased.

Examples of the polymerization initiator include a photoradical polymerization initiator, a photocationic polymerization initiator, a thermal radical polymerization initiator, and a thermal cationic polymerization initiator. These polymerization initiators may be constituted by a single polymerization initiator or may be constituted by a plurality of polymerization initiators.

Examples of the photoradical polymerization initiator include, but are not limited to, the following.

A 2,4,5-triaryl imidazole dimer which may have a substituent group such as a 2-(o-chlorophenyl)-4,5-diphenyl imidazole dimer, a 2-(o-chlorophenyl)-4,5-di(methoxyphenyl) imidazole dimer, a 2-(o-fluorophenyl)-4,5-diphenyl imidazole dimer, or a 2-(o- or p-methoxyphenyl)-4,5-diphenyl imidazole dimer; a benzophenone derivative such as benzophenone, N,N'-tetramethyl-4,4'-diamino benzophenone (Michler's ketone), N,N'-tetraethyl-4,4'-diamino benzophenone, 4-methoxy-4'-dimethylamino benzophenone, 4-chlorobenzophenone, 4,4'-dimethoxybenzophenone, or 4,4'-diaminobenzophenone; an α-amino aromatic ketone derivative such as 2-benzyl-2-dimethylamino-1-(4-morpholinophenyl)-butanone-1 or 2-methyl-1-[4-(methylthio) phenyl]-2-morpholino-propanone-1; quinones such as 2-ethylanthraquinone, phenanthrenequinone, 2-t-butyl anthraquinone, octamethyl anthraquinone, 1,2-benzanthraquinone, 2,3-benzanthraquinone, 2-phenyl anthraquinone, 2,3-diphenyl-anthraquinone, 1-chloroanthraquinone, 2-methyl anthraquinone, 1,4-naphthoquinone, 9,10-phenanthraquinone, 2-methyl-1,4-naphthoquinone, or 2,3-dimethyl anthraquinone; a benzoin ether derivative such as benzoin methyl ether, benzoin ethyl ether, or benzoin phenyl ether; a benzoin derivative such as benzoin, methyl benzoin, ethyl benzoin, or propyl benzoin; a benzyl derivative such as benzyl dimethyl ketal; an acridine derivative such as 9-phenylacridine or 1,7-bis(9,9'-acridinyl) heptane; an N-phenylglycine derivative such as N-phenylglycine; an acetophenone derivative such as acetophenone, 3-methylacetophenone, acetophenone benzyl ketal, 1-hydroxycyclohexyl phenyl ketone, or 2,2-dimethoxy-2-phenylacetophenone; a thioxanthone derivative such as thioxanthone, diethyl thioxanthone, 2-isopropyl thioxanthone, or 2-chlorothioxanthone; an acylphosphine oxide derivative such as 2,4,6-trimethylbenzoyldiphenylphosphine oxide, bis (2,4,6-trimethylbenzoyl) phenylphosphine oxide, or bis-(2, 6-dimethoxybenzoyl)-2,4,4-trimethylpentylphosphine oxide; an oxime ester derivative such as 1,2-octanedione, 1-[4-(phenylthio)-, 2-(O-benzoyloxime)], or ethanone, 1-[9-ethyl-6-(2-methylbenzoyl)-9H-carbazole-3-yl]-,1-(O-acetyloxime); and xanthone, fluorenone, benzaldehyde, fluorene, anthraquinone, triphenylamine, carbazole, 1-(4-isopropylphenyl)-2-hydroxy-2-methylpropane-1-one, or 2-hydroxy-2-methyl-1-phenylpropane-1-one.

Commercial products of a photoradical polymerization initiator include, but are not limited to, Irgacure 184, 369, 651, 500, 819, 907, 784, 2959, CGI-1700, -1750, -1850, CG24-61, Darocur 1173, Lucirin TPO, LR8893, and LR8970 (all manufactured by BASF, "Darocur" and "Lucirin" are registered trademarks), and EBECRYL P36 (manufactured by UCB).

As the photocationic polymerization initiator, onium salt, aromatic onium salt, arylsulfonium salt, or aryliodonium salt is preferable. Specific examples of an anion include a tetrafluoroborate ion, a hexafluorophosphate ion, a hexafluoroantimonate ion, a perchlorate ion, a trifluoromethanesulfonate ion, and a fluorosulfonic acid ion.

Commercial products of a photocationic polymerization initiator include CPI-210S (manufactured by San-Apro Ltd.), UVI-6950 (manufactured by Union Carbide Corporation), and ADEKA OPTIMER SP-150 (manufactured by ADEKA CORPORATION).

A content of the polymerization initiator in the coating liquid is preferably within a range from 0.01 parts by mass to 1.5 parts by mass and more preferably within a range from 0.03 parts by mass to 1.0 parts by mass relative to 100 parts by mass of a silsesquioxane solid content.

The coating liquid may be prepared by mixing particles constituted by a solid substance, a solvent, and a binder, as well as a polymerization initiator when necessary. An organic solvent is preferable as the solvent. While the organic solvent is not particularly limited, alcohol, carboxylic acid, aliphatic or alicyclic hydrocarbons, aromatic hydrocarbons, esters, ketones, ethers, or a mixed solvent of two or more organic solvents can be used.

Examples of alcohol include methanol, ethanol, 2-propanol, butanol, 2-methoxyethanol, 2-ethoxyethanol, 1-methoxy-2-propanol, 1-ethoxy-2-propanol, 1-propoxy-2-propanol, 4-methyl-2-pentanol, 2-ethyl butanol, 3-methoxy-3-methyl butanol, ethylene glycol, diethylene glycol, and glycerin.

Specific examples of carboxylic acid include n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid.

Specific examples of aliphatic or alicyclic hydrocarbons include n-hexane, n-octane, cyclohexane, cyclopentane, and cyclooctane.

As an aromatic hydrocarbon, toluene, xylene, ethylbenzene, and the like are preferable.

Examples of esters include ethyl formate, ethyl acetate, n-butyl acetate, ethylene glycol monomethyl ether acetate, ethylene glycol monoethyl ether acetate, ethylene glycol monobutyl ether acetate, and γ-butyrolactone.

Examples of ketones include acetone, methyl ethyl ketone, methyl isobutyl ketone, and cyclohexanone.

Examples of ethers include dimethoxyethane, tetrahydrofuran, dioxane, and diisopropyl ether.

When preparing the coating liquid, alcohol is preferably used among the various solvents described above from the perspective of solution stability.

The coating liquid can be prepared by adding a prescribed amount of a binder and, if necessary, a polymerization initiator to a liquid obtained in advance by dispersing particles constituted by a solid substance into a solvent. The liquid obtained by dispersing the particles in an organic solvent may be prepared by dispersing a particle powder in the solvent according to a method (such as a ball mill) similar to that of the dispersion process described above or a commercially available dispersion may be used instead.

When forming a film using the coating liquid, an inert gas atmosphere such as dry air or dry nitrogen is preferably adopted as an atmosphere in which coating is to be performed. A relative humidity of the dry atmosphere is preferably set to 30% or lower.

In addition, as a solution coating method for forming a film, known coating means such as a dipping method, a spin coating method, a spray method, a printing method, a flow coating method, and a combination thereof can be adopted as appropriate. Film thickness can be controlled by varying an extraction speed in the dipping method, a substrate rotational speed in the spin coating method, or the like and by varying a concentration of the coating liquid.

Curing of the obtained film may be performed by high-energy ray irradiation such as light irradiation or radioactive ray irradiation or by heating. Curing may be performed by concomitantly using high-energy ray irradiation and heating.

When performing curing by high-energy ray irradiation, examples of the high-energy ray include, but are not limited to, an electron ray, an X-ray, and an ultraviolet ray. When an ultraviolet ray is used as the high-energy ray, an irradiating wavelength region is preferably within a range from 160 nm to 400 nm and an output thereof is preferably within a range from 0.1 mW/cm$^2$ to 2000 mW/cm$^2$. From the perspective of preventing oxidation of silsesquioxane, an inert atmosphere such as nitrogen is preferably used as the curing atmosphere. When performing curing by heating, curing is performed for 1 minute to 20 minutes favorably in a temperature range of 50° C. to 250° C. or more favorably in a temperature range of 80° C. to 200° C.

<Structure of Film>

Figure 7:
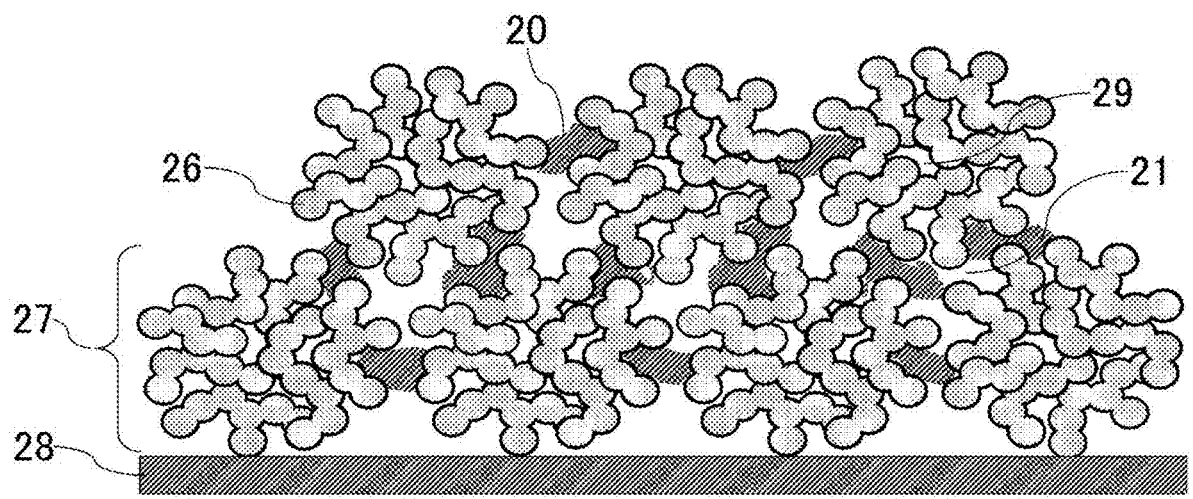
FIG. 7 is a diagram showing a structure of a film.

A structure of a film that contains a binder and an aggregation in which particles constituted by the solid substance are bound by the binder will be described with reference to FIG. 7.

Primary particles 26 constituted by a solid substance (for example, silica particles) form a three-dimensional structure and secondary particles 27 constituted by the solid substance (for example, silica particles) are formed. A large number of pores 29 within a range from about several nanometers to several ten nanometers exist inside the secondary particles 27. In addition, a binder 20 and the secondary particles 27 exist in the film so as to form an aggregation.

Furthermore, contact points between the primary particles 26 exhibit a complex mixture of completely-adhered portions and portions in which an interface is present. Such a structure is formed on a substrate 28 as a film. A large number of pores 21 are also formed in gaps between the secondary particles 27. The refractive index described earlier is realized due to the film containing the pores 29 inside the secondary particles as well as the pores 21 between the secondary particles in this manner. In addition, the strength of the film also increases.

Another structure of a film that contains a binder and an aggregation in which particles constituted by the solid substance are bound by the binder will be described with reference to FIG. 10.

Figure 10:
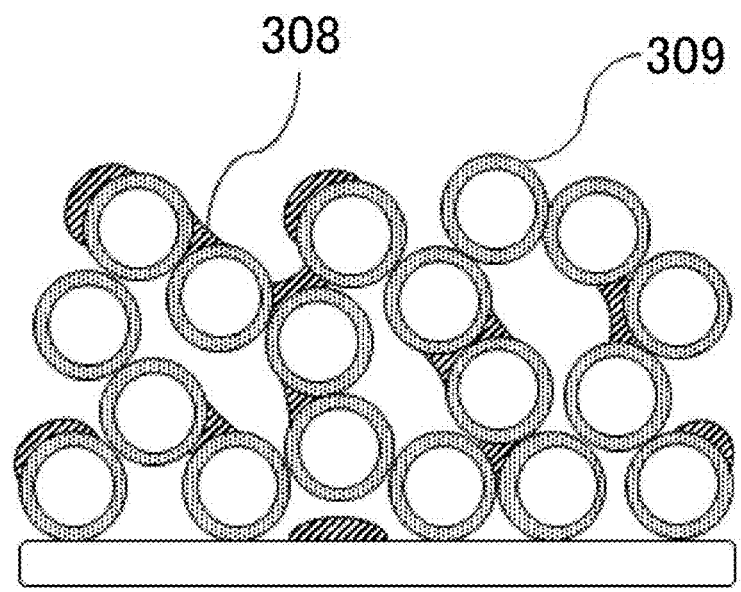
FIG. 10 is a diagram showing a structure of a film.

FIG. 10 shows a schematic view of a film containing particles (for example, hollow particles) constituted by a solid substance and a binder. When a binder 308 is introduced to a film containing hollow particles 309 which have a small surface area and which only have a small number of contact points between the hollow particles and the binder 308 and the hollow particles 309 form an aggregation, since the binder 308 positioned at the contact points between the hollow particles contributes to binding between the hollow particles 309, the strength of the film increases.

Meanwhile, when the content of the binder is excessive, an amount of the binder that does not contribute to binding between the hollow particles 309 increases. Such a binder not only does not contribute to increasing the strength of the functional film 5 but may also cause an increase in the refractive index n of the functional film 5. Therefore, the content of the binder in the functional film 5 is preferably not too large and, as described earlier, preferably satisfies a relationship expressed as (100−X−Y)<Y.

After the functional film is formed on the microlens array, a separately-prepared light-transmitting plate is bonded using a curable binding member (such as an adhesive), and the photoelectric conversion device is obtained by curing the binding member.

An equipment according to the present disclosure includes:

the photoelectric conversion device described above; and at least one selected from the group consisting of an optical system for forming an optical image on the photoelectric conversion device, a control device which controls the photoelectric conversion device, a processing device which processes a signal output from the photoelectric conversion device, a moving device which moves the photoelectric conversion device, and a display device which displays information based on a signal output from the photoelectric conversion device.

An example of the equipment according to the present disclosure is an image pickup system. In consideration thereof, the image pickup system will be described with reference to FIG. 2.

Figure 2:
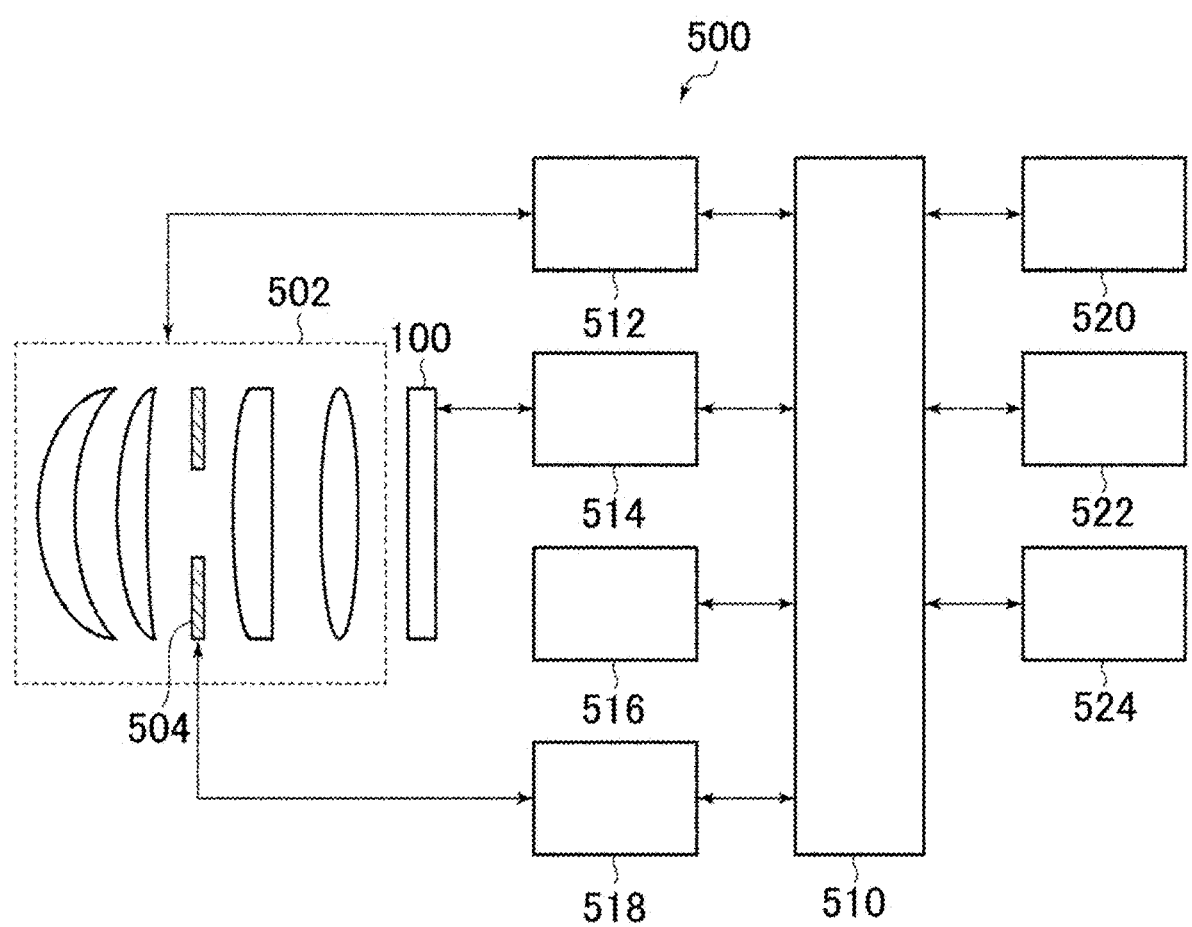
FIG. 2 is a block diagram showing a schematic configuration of an image pickup system.

FIG. 2 is a block diagram showing a schematic configuration of the image pickup system.

The photoelectric conversion device described above can be applied to various image pickup systems. While applicable image pickup systems are not particularly limited, examples thereof include equipments of various types such as a digital still camera, a digital camcorder, a monitoring camera, a copier, a facsimile, a scanner, a mobile phone, a vehicle-mounted camera, an observation satellite, and a camera for medical use. Examples of equipments provided with an image pickup system include electronic equipments such as various cameras, business equipments such as a copier, and information equipments such as a personal computer and a smartphone. Examples of equipments provided with an image pickup system also include transportation machines such as a vehicle, a ship, and an aircraft, an endoscope and medical instruments for radiological diagnosis, analytical instruments such as an electronic microscope, and industrial devices such as a robot.

In addition, camera modules provided with an optical system such as a lens and a photoelectric conversion device are also included in image pickup systems. FIG. 2 shows a block diagram of a digital still camera as an example of such image pickup systems.

As shown in FIG. 2, an image pickup system 500 includes a photoelectric conversion device 100, an image pickup optical system 502, a CPU 510, a lens control portion 512, an image pickup device control portion 514, an image processing portion 516, a diaphragm shutter control portion 518, a display portion 520, an operating switch 522, and a recording medium 524.

The image pickup optical system 502 is an optical system for forming an optical image of an object and includes a lens group, a diaphragm 504, and the like. The diaphragm 504 is equipped with a function for performing light amount adjustment during photography by adjusting an opening size thereof as well as a function as an exposure time adjustment shutter during still image photography. The lens group and the diaphragm 504 are held so as to be movable back and forth along an optical axis direction, and a variable magnification function (a zoom function) and a focusing function are realized by interlocked operations of the lens group and the diaphragm 504. The image pickup optical system 502 may be integrated with the image pickup system or may be an image pickup lens that is mountable to the image pickup system.

The photoelectric conversion device 100 is disposed in an image space of the image pickup optical system 502 so that an image pickup plane of the photoelectric conversion device 100 is positioned in the image space. The photoelectric conversion device 100 is the photoelectric conversion device described earlier and is configured so as to include a CMOS sensor (a pixel portion) and peripheral circuits (a peripheral circuit region) thereof. In the photoelectric conversion device 100, a plurality of pixels with a photoelectric conversion portion are two-dimensionally arranged, and a color filter is disposed relative to the pixels so as to constitute a two-dimensional single-board color sensor. The photoelectric conversion device 100 photoelectrically converts an object image formed by the image pickup optical system 502 and outputs the photoelectrically-converted object image as an image signal or a focus detection signal.

The lens control portion 512 is for performing variable magnification operations and focusing by controlling forward and backward drive of the lens group of the image pickup optical system 502 and is constituted by circuits and processing devices configured so as to realize such functions. The diaphragm shutter control portion 518 is for adjusting a photography light amount by varying an opening size of the diaphragm 504 (by making an aperture value variable) and is constituted by circuits and processing devices configured so as to realize such a function.

The CPU 510 is a control device inside the camera which performs various control of a camera main body, and includes a calculating portion, a ROM, a RAM, an A/D converter, a D/A converter, a communication interface circuit, and the like. The CPU 510 controls operations of various parts inside the camera in accordance with a computer program stored in the ROM or the like, and executes a series of photographic operations such as AF including detection of a focus state (focus detection) of the image pickup optical system 502, image pickup, image processing, and recording. The CPU 510 is also a signal processing portion.

The image pickup device control portion 514 is for controlling operations of the photoelectric conversion device 100 as well as subjecting a signal output from the photoelectric conversion device 100 to A/D conversion and transmitting the signal to the CPU 510, and is constituted by circuits and control devices configured so as to realize such functions. The A/D conversion function may be provided in the photoelectric conversion device 100 instead. The image processing portion 516 is a processing device which performs image processing such as γ conversion and color interpolation on the signal subjected to A/D conversion and generates an image signal, and is constituted by circuits and control devices configured so as to realize such functions. The display portion 520 is a display device such as a liquid crystal display (LCD) device and displays information related to a photography mode of the camera, a preview image prior to photography, a confirmation image after photography, a focusing state upon focus detection, and the like. The operating switch 522 is constituted by a power supply switch, a release (photography trigger) switch, a zoom operation switch, a photography mode selection switch, and the like. The recording medium 524 is for recording photographed images and the like and may be built into the image pickup system or may be a mountable and detachable recording medium such as a memory card.

By configuring the image pickup system 500 to which the photoelectric conversion device 100 described earlier is applied in this manner, a high-performance image pickup system can be realized.

Other examples of the equipment according to the present disclosure includes a moving body (a transportation device).

The moving body is a moving body including the photoelectric conversion device described earlier, a moving device, a processing device which acquires information from a signal output from the photoelectric conversion device, and a control device which controls the moving device based on the information.

Figure 3A:
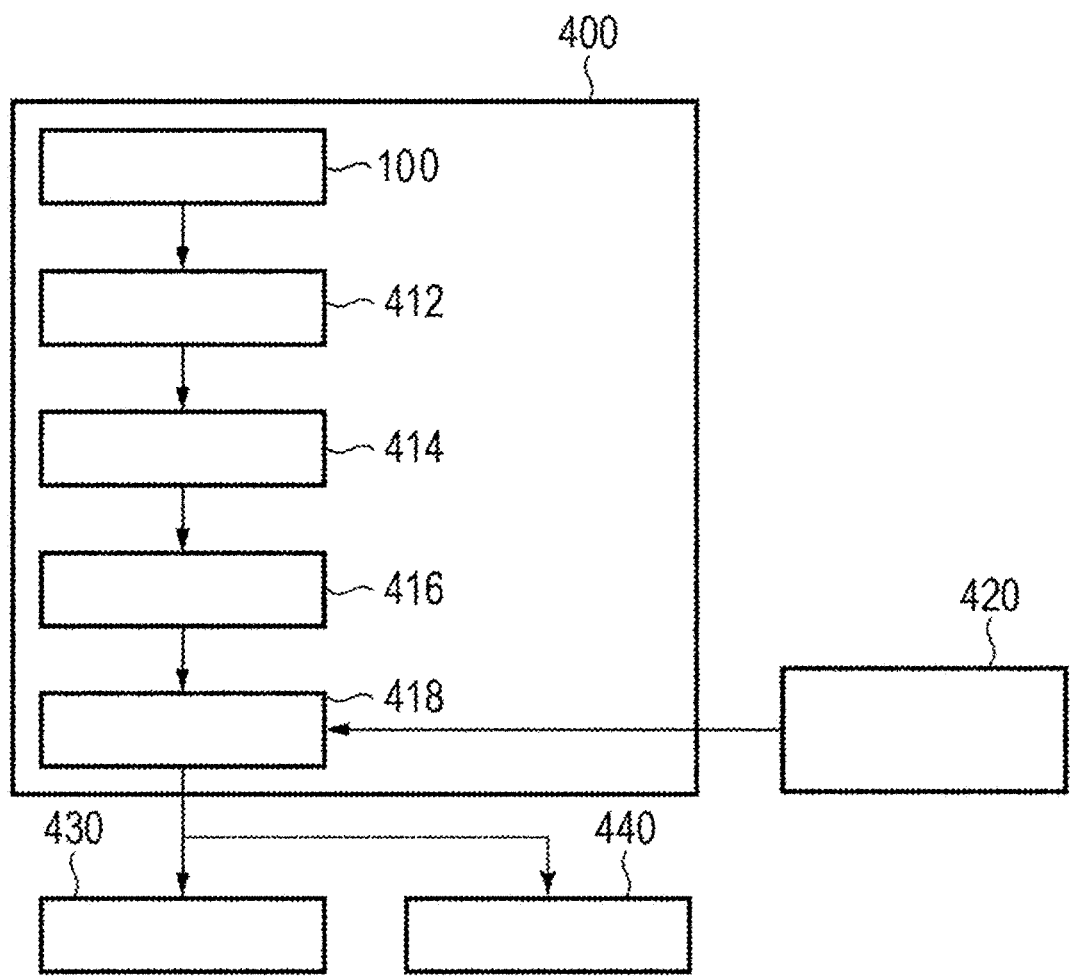
FIG. 3A is a diagram showing configurations of an image pickup system and a moving body.
Figure 3B:
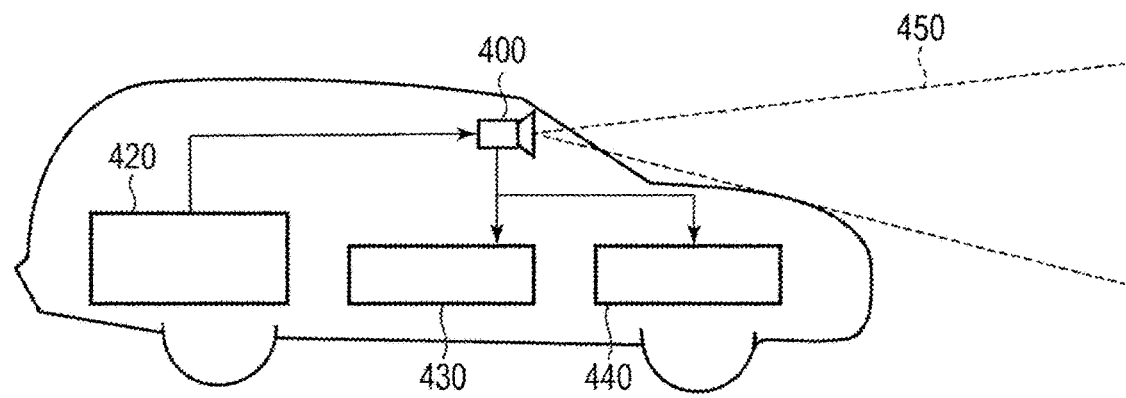
FIG. 3B is a diagram showing configurations of an image pickup system and a moving body.

Hereinafter, an image pickup system and a moving body will be described with reference to FIGS. 3A and 3B. FIGS. 3A and 3B are diagrams showing configurations of an image pickup system and a moving body.

FIG. 3A shows an example of an image pickup system 400 related to a vehicle-mounted camera.

The image pickup system 400 has a photoelectric conversion device 100. The photoelectric conversion device 100 is the photoelectric conversion device described earlier. The image pickup system 400 has an image processing portion 412 which is a processing device that performs image processing on a plurality of pieces of image data acquired by the photoelectric conversion device 100 and a parallax acquiring portion 414 which is a processing device that calculates a parallax (a phase difference of a parallax image) from the plurality of pieces of image data acquired by the photoelectric conversion device 100. In addition, the image pickup system 400 has a distance acquiring portion 416 which is a processing device that calculates a distance to an object based on the calculated parallax and a collision determining portion 418 which is a processing device that determines whether or not there is a possibility of a collision based on the calculated distance. In this case, the parallax acquiring portion 414 and the distance acquiring portion 416 are examples of a distance information acquiring portion which acquires information related to a distance to the object and the like. In other words, distance information is information related to a parallax, a defocus amount, a distance to the object, or the like. The collision determining portion 418 may determine a possibility of a collision using any of these pieces of distance information. The processing devices described above may be realized by exclusively-designed hardware or may be realized by general-purpose hardware which performs arithmetic operations based on a software module. Alternatively, the processing devices may be realized by an FPGA (Field Programmable Gate Array), an ASIC (Application Specific Integrated Circuit), or the like, or by a combination thereof.

The image pickup system 400 is connected to a vehicle information acquiring device 420 and is capable of acquiring vehicle information such as a vehicle speed, a yaw rate, and a steering angle. In addition, a control ECU 430 which is a control device that outputs a control signal causing a vehicle to generate a braking force based on a determination result of the collision determining portion 418 is connected to the image pickup system 400. In other words, the control ECU 430 is an example of a moving body control portion which controls a moving body based on distance information. Furthermore, the image pickup system 400 is also connected to a warning device 440 which issues a warning to a driver based on a determination result of the collision determining portion 418. For example, when it is found that the possibility of a collision is high as a determination result of the collision determining portion 418, the control ECU 430 performs vehicle control involving applying the brakes, releasing the gas pedal, suppressing engine output, or the like to avoid a collision and/or reduce damage. The warning device 440 issues a warning to a user by sounding an alarm, displaying warning information on a screen of a car navigation system or the like, vibrating a seat belt or a steering wheel, or the like.

In the present embodiment, an image of a periphery of the vehicle such as the front or the rear of the vehicle is picked up by the image pickup system 400. FIG. 3B shows the image pickup system 400 when an image of the front of the vehicle (an image pickup range 450) is picked up. The vehicle information acquiring device 420 sends an instruction to operate the image pickup system 400 and have the image pickup system 400 perform image pickup. Using the photoelectric conversion device described earlier as the photoelectric conversion device 100 enables the image pickup system 400 according to the present embodiment to further improve accuracy of ranging.

While an example of controlling a vehicle so as to prevent a collision with another vehicle has been described above, the image pickup system can also be applied to controlling automated driving so that the vehicle follows another vehicle, controlling automated driving so that the vehicle stays within a lane, and the like. In addition, the image pickup system is not limited to a vehicle such as an automobile and can also be applied to a moving body (a transportation machine) such as a ship, an airplane, or an industrial robot. A moving device in a moving body (transportation machine) refers to various driving sources such as an engine, a motor, a wheel, and a propeller. In a transportation machine mounted with a photoelectric conversion device, a moving device is capable of moving the photoelectric conversion device. Furthermore, besides moving bodies, the photoelectric conversion device can be applied to a wide variety of equipments that utilize object recognition such as an intelligent transportation system (ITS).

The photoelectric conversion device may have a structure (a chip stack structure) in which a first semiconductor chip provided with pixels and a second semiconductor chip provided with readout circuits are stacked. Each of the readout circuits in the second semiconductor chip can be configured as a row circuit corresponding to a row of pixels in the first semiconductor chip. Alternatively, each of the readout circuits in the second semiconductor chip can be configured as a matrix circuit corresponding to a pixel or a pixel block in the first semiconductor chip. As a connection between the first semiconductor chip and the second semiconductor chip, a through-electrode (TSV), inter-chip wiring by a direct bond using a metal such as copper (Cu), an inter-chip microbump, or the like can be adopted.

EXAMPLES

While the present disclosure will be hereinafter described with specificity using examples, it is to be understood that the present disclosure is not limited to the examples. "Parts" as described in the examples all refer to parts by mass. A "film" described below refers to a film that can be used as the functional film 5 in the photoelectric conversion device described above. In addition, the "film" described below refers to a film that can be used in various optical devices.

<Evaluation Method of Film>

An average transmittance (hereinafter, denoted by T and expressed in units of %) of the film can be calculated by expression (5) below using a haze (hereinafter, denoted by H and expressed in units of %) if a loss in transmittance due to reflections on front and rear surfaces of a substrate is to be ignored.

$$T=100-H \tag{5}$$

The haze is measured using a haze meter (HZ-V3, manufactured by Suga Test Instruments Co., Ltd.; standard light source D65, International Commission on Illumination (CIE)).

A refractive index (hereinafter, denoted by n) of the film is calculated according to expression (6) below using reflectance (hereinafter, denoted by R and expressed in units of %).

$$R/100=\{(n-n_a \times n_{sub})/(n+n_a \times n_{sub})\}^2 \tag{6}$$

where a local minimum value of reflectance closest to 500 nm is used as the reflectance.

$n_a$ denotes a refractive index of air and $n_{sub}$ denotes a refractive index of the substrate.

Reflectances are measured within a range of 380 nm to 800 nm using a reflectance measurement device (USPM-RU III, manufactured by Olympus Corporation).

When a level of the haze is high, since loss of reflectance is larger or, in other words, reflectance is lower than the actual reflectance, reliability of the refractive index obtained by expression (6) is lowered.

Therefore, in this case, the refractive index is determined to be unmeasurable when the haze exceeds 10%.

In addition, when a region with a different porosity exists on an interface between the film and the substrate or air, a local maximum value of the reflectance of the film may become larger than or smaller than the reflectance of the substrate. Even in such cases, since the reliability of the refractive index obtained from expression (6) is lowered, the refractive index of the film is determined to be unmeasurable.

A film thickness (hereinafter, denoted by t and expressed in units of nm) of the film is calculated from expression (7) below.

$$t=1/4n|\lambda_1 \cdot \lambda_2/(\lambda_1-\lambda_2)| \tag{7}$$

where n denotes the refractive index of the film calculated from expression (6), $\lambda_1$ nm denotes a wavelength that obtains a local minimum value of the reflectance closest to 550 nm used in expression (6), and $\lambda_2$ nm denotes a wavelength that obtains a local maximum value of the reflectance adjacent to $\lambda_1$.

<Preparation of Film-Forming Coating Liquid and Film Formation>

Fumed silica particles (manufactured by NIPPON AEROSIL CO., LTD.) were used as a skeleton that forms a film. The fumed silica particles and a solvent were measured and placed in a hermetically-sealable glass container so as to have a prescribed solid content concentration. Zirconia ($ZrO_2$) balls with a diameter of 0.5 mm were added to the solvent containing the fumed silica particles and the glass container was hermetically sealed. The fumed silica particles were dispersed by rotating the glass container on a ball mill rotating table at a rotational speed of 30 rpm.

A dispersion obtained by the dispersion process using the ball mill was adopted as a coating liquid.

The coating liquid was used to form a film by a spin coating method on a synthesized quartz glass substrate (diameter 30 mm, thickness 1 mm, and refractive index 1.46) cleansed in advance, and the coating liquid was dried at room temperature to obtain a film.

Alternatively, heating may be performed when drying the coating liquid. Although the heating may be performed at any temperature higher than room temperature, the heating may be performed within a temperature range of around 100° C. to 200° C. at, for example, 180° C. Performing heating during film formation may increase film strength.

<Structure of Film>

Figure 4:
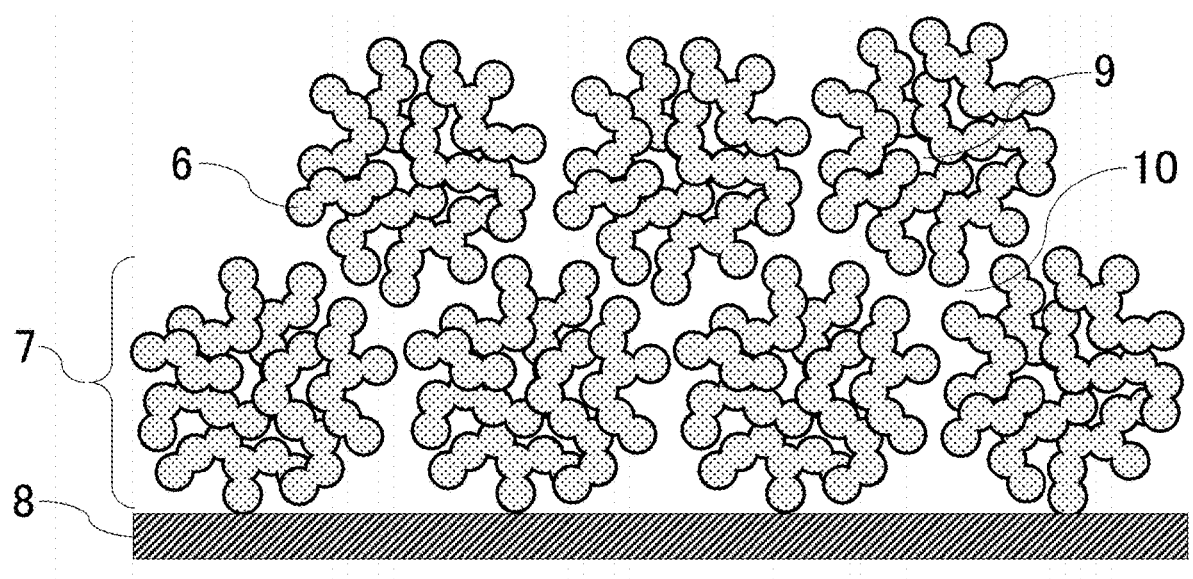
FIG. 4 is a diagram showing a structure of a film.

A structure of the obtained film will now be described with reference to FIG. 4.

Primary particles 6 of the fumed silica particles form a three-dimensional structure, and secondary particles 7 of the fumed silica particles are formed. A large number of pores 9 within a range from about several nm to several 10 nm exist inside the secondary particles 7. In addition, contact points between primary particles 6 exhibit a complex mixture of completely-adhered portions and portions in which an interface is present. Such a structure is formed on a substrate 8 as a film. A large number of pores 10 are also formed in gaps between the secondary particles 7. The refractive index described earlier is realized due to the film containing the pores 9 inside the secondary particles as well as the pores 10 between the secondary particles in this manner.

Examples 01-1, 01-2, 31-1, and 31-2

In the preparation of the film-forming coating liquid and film formation described above, AEROSIL 200 (manufactured by NIPPON AEROSIL CO., LTD.) which is a fumed silica particle with a hydroxy group exposed on a surface thereof was used as a skeleton that forms a film.

In addition, AEROSIL 200 was dispersed in propylene glycol monomethyl ether (PGME) so that a solid content concentration of AEROSIL 200 to be 6.88% by mass. Dispersion times were as shown in Tables 1-1 and 1-5.

The obtained coating liquid was used to form films under conditions shown in Tables 1-1 and 1-5. Physical properties of obtained films are shown in Tables 1-1 and 1-5.

Examples 02-1, 02-2, and 32-1 to 32-4

Film formation was performed in a similar manner to example 01-1 with the exception of changing the solid content concentration, the dispersion time, and the spin coating condition of AEROSIL 200 to those described in Tables 1-1 and 1-5.

Examples 03-1, 03-2, and 33-1

Film formation was performed in a similar manner to example 01-1 with the exception of changing the solid content concentration, the dispersion time, and the spin coating condition of AEROSIL 200 to those described in Tables 1-1 and 1-5.

Examples 04-1, 04-2, 34-1, and 34-2

Film formation was performed in a similar manner to example 01-1 with the exception of changing the solid content concentration, the dispersion time, and the spin coating condition of AEROSIL 200 to those described in Tables 1-1 and 1-5.

Examples 05-1, 05-2, and 35-1

Film formation was performed in a similar manner to example 01-1 with the exception of changing the solid content concentration, the dispersion time, and the spin coating condition of AEROSIL 200 to those described in Tables 1-1 and 1-5.

Examples 06-1 and 36-1

Film formation was performed in a similar manner to example 01-1 with the exception of using AEROSIL R812 (manufactured by NIPPON AEROSIL CO., LTD.) which is a fumed silica particle with a methyl group exposed on a surface thereof as a skeleton that forms a film and changing a solid content concentration, a dispersion time, and a spin coating condition of AEROSIL R812 to those described in Tables 1-1 and 1-5.

Examples 07-1 and 07-2

Film formation was performed in a similar manner to example 01-1 with the exception of using AEROSIL R711 (manufactured by NIPPON AEROSIL CO., LTD.) which is a fumed silica particle with a methacrylic group exposed on a surface thereof as a skeleton that forms a film and changing a solid content concentration, a dispersion time, and a spin coating condition of AEROSIL R711 to those described in Tables 1-1 and 1-5.

Examples 08-1 and 08-2

Film formation was performed in a similar manner to example 01-1 with the exception of using AEROSIL R976 (manufactured by NIPPON AEROSIL CO., LTD.) which is a fumed silica particle with a methyl group exposed on a surface thereof as a skeleton that forms a film and changing a solid content concentration, a dispersion time, and a spin coating condition of AEROSIL R976 to those described in Tables 1-1 and 1-5.

Examples 12-1 to 28-8 and 41-1 to 58-1

Film formation was performed in a similar manner to example 01-1 with the exception of changing various conditions applied to the coating liquid and the spin coating condition to those described in Tables 1-1 to 1-8.

TABLE 1-1

| Example | Coating liquid | | | | | | Spin coating | | | Film | | | | |
|---|---|---|---|---|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 01-1 | 200 | 12 | Hydroxy group | PGME | 6.88 | 48 | Synthetic quartz | 1000 | 10 | 1.07 | 0.56 | 99.4 | 1630 | A |
| 01-2 | 200 | 12 | Hydroxy group | PGME | 6.88 | 48 | Synthetic quartz | 2000 | 10 | 1.07 | 0.26 | 99.7 | 910 | A |
| 02-1 | 200 | 12 | Hydroxy group | PGME | 9.04 | 48 | Synthetic quartz | 2000 | 10 | 1.07 | 0.52 | 99.5 | 1830 | A |
| 02-2 | 200 | 12 | Hydroxy group | PGME | 9.04 | 72 | Synthetic quartz | 2000 | 10 | 1.09 | 0.53 | 99.5 | 1400 | A |
| 03-1 | 200 | 12 | Hydroxy group | PGME | 11.16 | 72 | Synthetic quartz | 4000 | 10 | 1.07 | 0.37 | 99.6 | 1380 | A |
| 03-2 | 200 | 12 | Hydroxy group | PGME | 11.16 | 72 | Synthetic quartz | 3000 | 10 | 1.07 | 1.09 | 98.9 | 1760 | A |
| 04-1 | 200 | 12 | Hydroxy group | PGME | 13.24 | 96 | Synthetic quartz | 5000 | 10 | 1.08 | 0.62 | 99.4 | 1640 | A |
| 04-2 | 200 | 12 | Hydroxy group | PGME | 13.24 | 72 | Synthetic quartz | 5000 | 10 | 1.06 | 1.01 | 99.0 | 1900 | A |
| 05-1 | 200 | 12 | Hydroxy group | PGME | 4.64 | 24 | Synthetic quartz | 1000 | 10 | 1.08 | 0.33 | 99.7 | 920 | A |
| 05-2 | 200 | 12 | Hydroxy group | PGME | 4.64 | 48 | Synthetic quartz | 1000 | 10 | 1.11 | 0.24 | 99.8 | 650 | A |
| 06-1 | R812 | 7 | Methyl group | PGME | 9.04 | 8 | Synthetic quartz | 2000 | 10 | 1.06 | 0.46 | 99.5 | 2280 | A |
| 07-1 | R711 | 12 | Methacrylic group | PGME | 9.04 | 48 | Synthetic quartz | 2000 | 10 | 1.10 | 0.60 | 99.4 | 890 | A |
| 07-2 | R711 | 12 | Methacrylic group | PGME | 11.16 | 48 | Synthetic quartz | 3000 | 10 | 1.11 | 0.60 | 99.4 | 1200 | A |
| 08-1 | R976 | 7 | Methyl group | PGME | 9.04 | 24 | Synthetic quartz | 2000 | 10 | 1.06 | 0.40 | 99.6 | 1620 | A |
| 08-2 | R976 | 7 | Methyl group | PGME | 9.04 | 36 | Synthetic quartz | 2000 | 10 | 1.07 | 0.30 | 99.7 | 1500 | A |
| 12-1 | 200 | 12 | Hydroxy group | PGME | 4.64 | 24 | Synthetic quartz | 2000 | 10 | 1.07 | 0.39 | 99.6 | 620 | A |
| 13-1 | 200 | 12 | Hydroxy group | PGME | 6.88 | 72 | Synthetic quartz | 1000 | 10 | 1.09 | 0.86 | 99.1 | 1360 | A |
| 13-2 | 200 | 12 | Hydroxy group | PGME | 6.88 | 72 | Synthetic quartz | 2000 | 10 | 1.09 | 0.20 | 99.8 | 810 | A |
| 14-1 | 200 | 12 | Hydroxy group | PGME | 9.04 | 48 | Synthetic quartz | 3000 | 10 | 1.07 | 0.40 | 99.6 | 1460 | A |
| 14-2 | 200 | 12 | Hydroxy group | PGME | 9.04 | 72 | Synthetic quartz | 3000 | 10 | 1.08 | 0.33 | 99.7 | 1160 | A |
| 14-3 | 200 | 12 | Hydroxy group | PGME | 9.04 | 384 | Synthetic quartz | 2000 | 10 | 1.14 | 0.38 | 99.6 | 830 | A |

TABLE 1-2

| Example | Coating liquid | | | | | | Spin coating | | | Film | | | | |
|---|---|---|---|---|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 15-1 | 200 | 12 | Hydroxy group | PGME | 11.16 | 96 | Synthetic quartz | 3000 | 10 | 1.09 | 0.50 | 99.5 | 1410 | A |
| 15-2 | 200 | 12 | Hydroxy group | PGME | 11.16 | 96 | Synthetic quartz | 4000 | 10 | 1.08 | 0.50 | 99.5 | 1400 | A |
| 15-3 | 200 | 12 | Hydroxy group | PGME | 11.16 | 120 | Synthetic quartz | 3000 | 10 | 1.10 | 0.76 | 99.2 | 1330 | A |
| 15-4 | 200 | 12 | Hydroxy group | PGME | 11.16 | 120 | Synthetic quartz | 4000 | 10 | 1.10 | 0.33 | 99.7 | 1170 | A |
| 18-1 | R812 | 7 | Methyl group | PGME | 4.64 | 8 | Synthetic quartz | 1000 | 10 | 1.05 | 0.39 | 99.6 | 1250 | A |
| 18-2 | R812 | 7 | Methyl group | PGME | 4.64 | 8 | Synthetic quartz | 2000 | 10 | 1.05 | 0.23 | 99.8 | 520 | A |
| 19-1 | R812 | 7 | Methyl group | PGME | 6.88 | 8 | Synthetic quartz | 1000 | 10 | 1.06 | 0.46 | 99.5 | 1970 | A |
| 19-2 | R812 | 7 | Methyl group | PGME | 6.88 | 8 | Synthetic quartz | 2000 | 10 | 1.05 | 0.36 | 99.6 | 1420 | A |
| 19-3 | R812 | 7 | Methyl group | PGME | 6.88 | 8 | Synthetic quartz | 3000 | 10 | 1.05 | 0.27 | 99.7 | 1190 | A |
| 20-1 | R812 | 7 | Methyl group | PGME | 9.04 | 8 | Synthetic quartz | 4000 | 10 | 1.07 | 0.36 | 99.6 | 1950 | A |
| 20-10 | R812 | 7 | Methyl group | PGME | 9.04 | 24 | Synthetic quartz | 4000 | 10 | 1.07 | 0.30 | 99.7 | 1480 | A |
| 20-11 | R812 | 7 | Methyl group | PGME | 9.04 | 384 | Synthetic quartz | 2000 | 10 | 1.14 | 0.25 | 99.8 | 960 | A |
| 20-2 | R812 | 7 | Methyl group | PGME | 9.04 | 8 | Synthetic quartz | 4000 | 10 | 1.05 | 0.43 | 99.6 | 1610 | A |
| 20-3 | R812 | 7 | Methyl group | PGME | 9.04 | 16 | Synthetic quartz | 1000 | 10 | 1.06 | 1.06 | 98.9 | 2920 | A |
| 20-4 | R812 | 7 | Methyl group | PGME | 9.04 | 16 | Synthetic quartz | 2000 | 10 | 1.06 | 0.43 | 99.6 | 2360 | A |
| 20-5 | R812 | 7 | Methyl group | PGME | 9.04 | 16 | Synthetic quartz | 3000 | 10 | 1.06 | 0.33 | 99.7 | 1660 | A |
| 20-6 | R812 | 7 | Methyl group | PGME | 9.04 | 16 | Synthetic quartz | 4000 | 10 | 1.06 | 0.30 | 99.7 | 1440 | A |
| 20-7 | R812 | 7 | Methyl group | PGME | 9.04 | 24 | Synthetic quartz | 1000 | 10 | 1.07 | 0.86 | 99.1 | 2550 | A |
| 20-8 | R812 | 7 | Methyl group | PGME | 9.04 | 24 | Synthetic quartz | 2000 | 10 | 1.07 | 0.40 | 99.6 | 2120 | A |
| 20-9 | R812 | 7 | Methyl group | PGME | 9.04 | 24 | Synthetic quartz | 3000 | 10 | 1.07 | 0.30 | 99.7 | 1690 | A |

TABLE 1-3

| Example | Coating liquid | | | | | | Spin coating | | | Film | | | | |
|---|---|---|---|---|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 21-1 | R812 | 7 | Methyl group | PGME | 11.16 | 24 | Synthetic quartz | 2000 | 10 | 1.06 | 1.27 | 98.7 | 2890 | A |
| 21-2 | R812 | 7 | Methyl group | PGME | 11.16 | 24 | Synthetic quartz | 3000 | 10 | 1.06 | 0.77 | 99.2 | 2570 | A |
| 21-3 | R812 | 7 | Methyl group | PGME | 11.16 | 24 | Synthetic quartz | 4000 | 10 | 1.06 | 0.77 | 99.2 | 2080 | A |
| 21-4 | R812 | 7 | Methyl group | PGME | 11.16 | 48 | Synthetic quartz | 2000 | 10 | 1.07 | 0.93 | 99.1 | 2460 | A |
| 21-5 | R812 | 7 | Methyl group | PGME | 11.16 | 48 | Synthetic quartz | 3000 | 10 | 1.07 | 0.53 | 99.5 | 1900 | A |
| 21-6 | R812 | 7 | Methyl group | PGME | 11.16 | 48 | Synthetic quartz | 4000 | 10 | 1.07 | 0.53 | 99.5 | 1910 | A |
| 21-7 | R812 | 7 | Methyl group | PGME | 11.16 | 72 | Synthetic quartz | 2000 | 10 | 1.08 | 0.83 | 99.2 | 2230 | A |
| 21-8 | R812 | 7 | Methyl group | PGME | 11.16 | 72 | Synthetic quartz | 3000 | 10 | 1.08 | 0.43 | 99.6 | 1940 | A |
| 21-9 | R812 | 7 | Methyl group | PGME | 11.16 | 72 | Synthetic quartz | 4000 | 10 | 1.08 | 0.37 | 99.6 | 1600 | A |
| 22-1 | R812 | 7 | Methyl group | PGME | 13.24 | 72 | Synthetic quartz | 4000 | 10 | 1.08 | 1.43 | 98.6 | 2490 | A |
| 24-1 | R711 | 12 | Methacrylic group | PGME | 4.64 | 24 | Synthetic quartz | 1000 | 10 | 1.09 | 0.43 | 99.6 | 630 | A |
| 24-2 | R711 | 12 | Methacrylic group | PGME | 4.64 | 24 | Synthetic quartz | 2000 | 10 | 1.10 | 0.36 | 99.6 | 440 | B |

TABLE 1-3-continued

| | Coating liquid | | | | | | Spin coating | | | Film | | | |
|---|---|---|---|---|---|---|---|---|---|---|---|---|---|
| Example | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 25-1 | R711 | 12 | Methacrylic group | PGME | 6.88 | 12 | Synthetic quartz | 1000 | 10 | 1.06 | 0.96 | 99.0 | 1240 | A |
| 25-2 | R711 | 12 | Methacrylic group | PGME | 6.88 | 12 | Synthetic quartz | 2000 | 10 | 1.07 | 0.70 | 99.3 | 920 | A |
| 25-3 | R711 | 12 | Methacrylic group | PGME | 6.88 | 24 | Synthetic quartz | 1000 | 10 | 1.09 | 0.66 | 99.3 | 1050 | A |
| 25-4 | R711 | 12 | Methacrylic group | PGME | 6.88 | 24 | Synthetic quartz | 2000 | 10 | 1.08 | 0.46 | 99.5 | 770 | A |
| 26-1 | R711 | 12 | Methacrylic group | PGME | 9.04 | 12 | Synthetic quartz | 3000 | 10 | 1.06 | 0.86 | 99.1 | 1210 | A |
| 26-2 | R711 | 12 | Methacrylic group | PGME | 9.04 | 24 | Synthetic quartz | 1000 | 10 | 1.08 | 1.09 | 98.9 | 1670 | A |
| 26-3 | R711 | 12 | Methacrylic group | PGME | 9.04 | 24 | Synthetic quartz | 2000 | 10 | 1.08 | 0.66 | 99.3 | 1150 | A |
| 26-4 | R711 | 12 | Methacrylic group | PGME | 9.04 | 24 | Synthetic quartz | 3000 | 10 | 1.08 | 0.63 | 99.4 | 1080 | A |
| 26-5 | R711 | 12 | Methacrylic group | PGME | 9.04 | 36 | Synthetic quartz | 1000 | 10 | 1.09 | 0.76 | 99.2 | 1660 | A |
| 26-7 | R711 | 12 | Methacrylic group | PGME | 9.04 | 36 | Synthetic quartz | 2000 | 10 | 1.09 | 0.56 | 99.4 | 1070 | A |
| 26-8 | R711 | 12 | Methacrylic group | PGME | 9.04 | 36 | Synthetic quartz | 3000 | 10 | 1.09 | 0.46 | 99.5 | 870 | A |

TABLE 1-4

| Example | Coating liquid | | | | | | Spin coating | | |
|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] |
| 27-1 | R711 | 12 | Methacrylic group | PGME | 11.16 | 12 | Synthetic quartz | 3000 | 10 |
| 27-2 | R711 | 12 | Methacrylic group | PGME | 11.16 | 24 | Synthetic quartz | 2000 | 10 |
| 27-3 | R711 | 12 | Methacrylic group | PGME | 11.16 | 24 | Synthetic quartz | 3000 | 10 |
| 27-4 | R711 | 12 | Methacrylic group | PGME | 11.16 | 36 | Synthetic quartz | 1000 | 10 |
| 27-5 | R711 | 12 | Methacrylic group | PGME | 11.16 | 36 | Synthetic quartz | 2000 | 10 |
| 27-6 | R711 | 12 | Methacrylic group | PGME | 11.16 | 36 | Synthetic quartz | 3000 | 10 |
| 27-7 | R711 | 12 | Methacrylic group | PGME | 11.16 | 192 | Synthetic quartz | 2000 | 10 |
| 28-1 | R711 | 12 | Methacrylic group | PGME | 13.24 | 24 | Synthetic quartz | 2000 | 10 |
| 28-2 | R711 | 12 | Methacrylic group | PGME | 13.24 | 24 | Synthetic quartz | 3000 | 10 |
| 28-3 | R711 | 12 | Methacrylic group | PGME | 13.24 | 48 | Synthetic quartz | 1000 | 10 |
| 28-4 | R711 | 12 | Methacrylic group | PGME | 13.24 | 48 | Synthetic quartz | 2000 | 10 |
| 28-5 | R711 | 12 | Methacrylic group | PGME | 13.24 | 48 | Synthetic quartz | 3000 | 10 |
| 28-6 | R711 | 12 | Methacrylic group | PGME | 13.24 | 72 | Synthetic quartz | 1000 | 10 |
| 28-7 | R711 | 12 | Methacrylic group | PGME | 13.24 | 72 | Synthetic quartz | 2000 | 10 |
| 28-8 | R711 | 12 | Methacrylic group | PGME | 13.24 | 72 | Synthetic quartz | 3000 | 10 |

| Example | Film | | | | |
|---|---|---|---|---|---|
| | Refractive index [—] | Haze [%] | Transmittance [%] | Film thickness [nm] | Classification |
| 27-1 | 1.06 | 0.96 | 99.0 | 1730 | A |
| 27-2 | 1.08 | 0.96 | 99.0 | 1600 | A |
| 27-3 | 1.08 | 0.73 | 99.3 | 1300 | A |
| 27-4 | 1.09 | 1.03 | 99.0 | 2180 | A |
| 27-5 | 1.10 | 0.70 | 99.3 | 1390 | A |
| 27-6 | 1.10 | 0.46 | 99.5 | 1140 | A |
| 27-7 | 1.15 | 0.25 | 99.8 | 870 | A |
| 28-1 | 1.07 | 1.10 | 98.9 | 2170 | A |
| 28-2 | 1.07 | 1.03 | 99.0 | 1930 | A |
| 28-3 | 1.09 | 0.97 | 99.0 | 1910 | A |
| 28-4 | 1.10 | 0.70 | 99.3 | 1420 | A |
| 28-5 | 1.07 | 1.03 | 99.0 | 1930 | A |
| 28-6 | 1.10 | 0.80 | 99.2 | 1500 | A |
| 28-7 | 1.10 | 0.63 | 99.4 | 1400 | A |
| 28-8 | 1.10 | 0.46 | 99.5 | 1140 | A |

TABLE 1-5

| Example | Coating liquid | | | | | | Spin coating | | | Film | | | | |
|---|---|---|---|---|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 31-1 | 200 | 12 | Hydroxy group | PGME | 6.88 | 24 | Synthetic quartz | 1000 | 10 | — | 0.81 | 99.2 | 1690 | E |
| 31-2 | 200 | 12 | Hydroxy group | PGME | 6.88 | 24 | Synthetic quartz | 2000 | 10 | — | 0.51 | 99.5 | 1270 | E |
| 32-1 | 200 | 12 | Hydroxy group | PGME | 9.04 | 24 | Synthetic quartz | 1000 | 10 | — | 7.54 | 92.5 | 3440 | E |
| 32-2 | 200 | 12 | Hydroxy group | PGME | 9.04 | 24 | Synthetic quartz | 2000 | 10 | — | 0.67 | 99.3 | 1890 | E |
| 32-3 | 200 | 12 | Hydroxy group | PGME | 9.04 | 48 | Synthetic quartz | 1000 | 10 | — | 6.44 | 93.6 | 2470 | E |
| 32-4 | 200 | 12 | Hydroxy group | PGME | 9.04 | 72 | Synthetic quartz | 1000 | 10 | — | 5.22 | 94.8 | 2160 | E |
| 33-1 | 200 | 12 | Hydroxy group | PGME | 11.16 | 72 | Synthetic quartz | 2000 | 10 | 1.07 | 4.29 | 95.7 | 2360 | D |
| 34-1 | 200 | 12 | Hydroxy group | PGME | 13.24 | 72 | Synthetic quartz | 4000 | 10 | 1.06 | 2.67 | 97.3 | 2430 | D |
| 34-2 | 200 | 12 | Hydroxy group | PGME | 13.24 | 96 | Synthetic quartz | 4000 | 10 | 1.07 | 3.24 | 96.8 | 2060 | D |
| 35-1 | 200 | 12 | Hydroxy group | PGME | 4.64 | 48 | Synthetic quartz | 2000 | 10 | 1.11 | 0.31 | 99.7 | 410 | B |
| 36-1 | R812 | 7 | Methyl group | PGME | 9.04 | 4 | Synthetic quartz | 2000 | 10 | — | 0.47 | 99.5 | 2480 | E |
| 41-1 | 200 | 12 | Hydroxy group | PGME | 2.35 | 6 | Synthetic quartz | 1000 | 10 | — | 0.82 | 99.2 | 380 | E |
| 41-2 | 200 | 12 | Hydroxy group | PGME | 2.35 | 12 | Synthetic quartz | 1000 | 10 | — | 0.48 | 99.5 | — | E |
| 41-3 | 200 | 12 | Hydroxy group | PGME | 2.35 | 24 | Synthetic quartz | 1000 | 10 | 1.06 | 0.52 | 99.5 | 340 | B |
| 42-1 | 200 | 12 | Hydroxy group | PGME | 4.64 | 6 | Synthetic quartz | 1000 | 10 | — | 0.72 | 99.3 | 1170 | E |
| 42-2 | 200 | 12 | Hydroxy group | PGME | 4.64 | 6 | Synthetic quartz | 2000 | 10 | — | 0.69 | 99.3 | 960 | E |
| 42-3 | 200 | 12 | Hydroxy group | PGME | 4.64 | 12 | Synthetic quartz | 1000 | 10 | — | 0.91 | 99.1 | 1050 | E |
| 42-4 | 200 | 12 | Hydroxy group | PGME | 4.64 | 12 | Synthetic quartz | 2000 | 10 | — | 0.98 | 99.0 | 700 | E |
| 44-1 | 200 | 12 | Hydroxy group | PGME | 9.04 | 24 | Synthetic quartz | 3000 | 10 | — | 0.47 | 99.5 | 1880 | E |
| 44-2 | 200 | 12 | Hydroxy group | PGME | 9.04 | 768 | Synthetic quartz | 2000 | 10 | 1.17 | 0.45 | 99.6 | 680 | C |
| 45-1 | 200 | 12 | Hydroxy group | PGME | 11.16 | 96 | Synthetic quartz | 2000 | 10 | 1.08 | 2.62 | 97.4 | 2040 | D |
| 45-2 | 200 | 12 | Hydroxy group | PGME | 11.16 | 120 | Synthetic quartz | 2000 | 10 | 1.09 | 2.49 | 97.5 | 1660 | D |

TABLE 1-6

| Example | Coating liquid | | | | | | Spin coating | | | Film | | | | |
|---|---|---|---|---|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 46-1 | 200 | 12 | Hydroxy group | PGME | 13.24 | 72 | Synthetic quartz | 3000 | 10 | 1.06 | 7.50 | 92.5 | 2440 | D |
| 46-2 | 200 | 12 | Hydroxy group | PGME | 13.24 | 96 | Synthetic quartz | 3000 | 10 | 1.07 | 7.33 | 92.7 | 2290 | D |
| 46-3 | 200 | 12 | Hydroxy group | PGME | 13.24 | 120 | Synthetic quartz | 3000 | 10 | 1.07 | 7.19 | 92.8 | 1990 | D |
| 46-4 | 200 | 12 | Hydroxy group | PGME | 13.24 | 120 | Synthetic quartz | 4000 | 10 | 1.09 | 2.19 | 97.8 | 1770 | D |
| 46-5 | 200 | 12 | Hydroxy group | PGME | 13.24 | 120 | Synthetic quartz | 5000 | 10 | 1.09 | 1.56 | 98.4 | 1670 | D |
| 47-1 | R812 | 7 | Methyl group | PGME | 2.35 | 2 | Synthetic quartz | 1000 | 10 | — | 0.52 | 99.5 | 400 | E |
| 47-2 | R812 | 7 | Methyl group | PGME | 2.35 | 4 | Synthetic quartz | 1000 | 10 | — | 0.52 | 99.5 | 570 | E |
| 47-3 | R812 | 7 | Methyl group | PGME | 2.35 | 8 | Synthetic quartz | 1000 | 10 | 1.06 | 0.46 | 99.5 | 430 | B |
| 48-1 | R812 | 7 | Methyl group | PGME | 4.64 | 2 | Synthetic quartz | 1000 | 10 | — | 0.46 | 99.5 | 1140 | E |
| 48-2 | R812 | 7 | Methyl group | PGME | 4.64 | 2 | Synthetic quartz | 2000 | 10 | — | 0.29 | 99.7 | 860 | E |
| 48-3 | R812 | 7 | Methyl group | PGME | 4.64 | 4 | Synthetic quartz | 1000 | 10 | — | 0.59 | 99.4 | 1160 | E |
| 48-4 | R812 | 7 | Methyl group | PGME | 4.64 | 4 | Synthetic quartz | 2000 | 10 | — | 0.78 | 99.2 | 820 | E |
| 49-1 | R812 | 7 | Methyl group | PGME | 6.88 | 4 | Synthetic quartz | 1000 | 10 | — | 0.49 | 99.5 | 2110 | E |
| 49-2 | R812 | 7 | Methyl group | PGME | 6.88 | 4 | Synthetic quartz | 2000 | 10 | — | 0.39 | 99.6 | 1510 | E |
| 49-3 | R812 | 7 | Methyl group | PGME | 6.88 | 4 | Synthetic quartz | 3000 | 10 | — | 0.33 | 99.7 | 1440 | E |
| 50-1 | R812 | 7 | Methyl group | PGME | 9.04 | 4 | Synthetic quartz | 1000 | 10 | — | 2.06 | 97.9 | 3810 | E |
| 50-2 | R812 | 7 | Methyl group | PGME | 9.04 | 4 | Synthetic quartz | 3000 | 10 | — | 0.46 | 99.5 | 2180 | E |
| 50-3 | R812 | 7 | Methyl group | PGME | 9.04 | 4 | Synthetic quartz | 4000 | 10 | — | 0.43 | 99.6 | 2060 | E |
| 50-4 | R812 | 7 | Methyl group | PGME | 9.04 | 8 | Synthetic quartz | 1000 | 10 | — | 1.41 | 98.6 | 3310 | E |
| 50-5 | R812 | 7 | Methyl group | PGME | 9.04 | 768 | Synthetic quartz | 2000 | 10 | 1.17 | 0.23 | 99.8 | 820 | C |

TABLE 1-7

| Example | Coating liquid | | | | | | Spin coating | | | Film | | | |
|---|---|---|---|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] | Refractive index [—] | Haze [%] | Transmittance [%] | Film thickness [nm] | Classification |
| 51-1 | R812 | 7 | Methyl group | PGME | 11.16 | 24 | Synthetic quartz | 1000 | 10 | — | 2.97 | 97.0 | 4490 | E |
| 51-2 | R812 | 7 | Methyl group | PGME | 11.16 | 48 | Synthetic quartz | 1000 | 10 | 1.07 | 2.62 | 97.4 | 3620 | D |
| 51-3 | R812 | 7 | Methyl group | PGME | 11.16 | 72 | Synthetic quartz | 1000 | 10 | 1.08 | 2.52 | 97.5 | 3080 | D |
| 52-1 | R812 | 7 | Methyl group | PGME | 13.24 | 24 | Synthetic quartz | 1000 | 10 | — | 4.24 | 95.8 | 7030 | E |
| 52-10 | R812 | 7 | Methyl group | PGME | 13.24 | 72 | Synthetic quartz | 2000 | 10 | 1.07 | 1.82 | 98.2 | 2830 | D |
| 52-11 | R812 | 7 | Methyl group | PGME | 13.24 | 72 | Synthetic quartz | 3000 | 10 | 1.08 | 2.05 | 98.0 | 2900 | D |
| 52-2 | R812 | 7 | Methyl group | PGME | 13.24 | 24 | Synthetic quartz | 2000 | 10 | — | 3.54 | 96.5 | 5710 | E |
| 52-3 | R812 | 7 | Methyl group | PGME | 13.24 | 24 | Synthetic quartz | 3000 | 10 | — | 2.67 | 97.3 | 3950 | E |
| 52-4 | R812 | 7 | Methyl group | PGME | 13.24 | 24 | Synthetic quartz | 4000 | 10 | — | 2.13 | 97.9 | 3890 | E |
| 52-5 | R812 | 7 | Methyl group | PGME | 13.24 | 48 | Synthetic quartz | 1000 | 10 | — | 6.11 | 93.9 | 5490 | E |
| 52-6 | R812 | 7 | Methyl group | PGME | 13.24 | 48 | Synthetic quartz | 2000 | 10 | 1.06 | 2.79 | 97.2 | 4050 | D |
| 52-7 | R812 | 7 | Methyl group | PGME | 13.24 | 48 | Synthetic quartz | 3000 | 10 | 1.07 | 1.76 | 98.2 | 3050 | D |
| 52-8 | R812 | 7 | Methyl group | PGME | 13.24 | 48 | Synthetic quartz | 4000 | 10 | 1.07 | 2.56 | 97.4 | 2990 | D |
| 52-9 | R812 | 7 | Methyl group | PGME | 13.24 | 72 | Synthetic quartz | 1000 | 10 | — | 3.76 | 96.2 | 4730 | E |
| 53-1 | R711 | 12 | Methacrylic group | PGME | 2.35 | 6 | Synthetic quartz | 1000 | 10 | — | 0.43 | 99.6 | 310 | E |
| 53-2 | R711 | 12 | Methacrylic group | PGME | 2.35 | 6 | Synthetic quartz | 2000 | 10 | — | 0.37 | 99.6 | — | E |
| 53-3 | R711 | 12 | Methacrylic group | PGME | 2.35 | 12 | Synthetic quartz | 1000 | 10 | — | 0.43 | 99.6 | 290 | E |
| 53-4 | R711 | 12 | Methacrylic group | PGME | 2.35 | 12 | Synthetic quartz | 2000 | 10 | — | 0.27 | 99.7 | — | E |

TABLE 1-8

| Example | Coating liquid | | | | | | Spin coating | | |
|---|---|---|---|---|---|---|---|---|---|
| | Particle AEROSIL | Primary particle size [nm] | Particle surface | Solvent | Solid content concentration [mass %] | Dispersion time [h] | Substrate | Rotational speed [rpm] | Time [s] |
| 54-1 | R711 | 12 | Methacrylic group | PGME | 4.64 | 6 | Synthetic quartz | 1000 | 10 |
| 54-2 | R711 | 12 | Methacrylic group | PGME | 4.64 | 6 | Synthetic quartz | 2000 | 10 |
| 54-3 | R711 | 12 | Methacrylic group | PGME | 4.64 | 12 | Synthetic quartz | 1000 | 10 |
| 54-4 | R711 | 12 | Methacrylic group | PGME | 4.64 | 12 | Synthetic quartz | 2000 | 10 |
| 55-1 | R711 | 12 | Methacrylic group | PGME | 6.88 | 6 | Synthetic quartz | 1000 | 10 |
| 55-2 | R711 | 12 | Methacrylic group | PGME | 6.88 | 6 | Synthetic quartz | 2000 | 10 |
| 56-1 | R711 | 12 | Methacrylic group | PGME | 9.04 | 12 | Synthetic quartz | 1000 | 10 |
| 56-2 | R711 | 12 | Methacrylic group | PGME | 9.04 | 12 | Synthetic quartz | 2000 | 10 |
| 57-1 | R711 | 12 | Methacrylic group | PGME | 11.16 | 12 | Synthetic quartz | 1000 | 10 |
| 57-2 | R711 | 12 | Methacrylic group | PGME | 11.16 | 12 | Synthetic quartz | 2000 | 10 |
| 57-3 | R711 | 12 | Methacrylic group | PGME | 11.16 | 24 | Synthetic quartz | 1000 | 10 |
| 57-4 | R711 | 12 | Methacrylic group | PGME | 11.16 | 384 | Synthetic quartz | 2000 | 10 |
| 58-1 | R711 | 12 | Methacrylic group | PGME | 13.24 | 24 | Synthetic quartz | 1000 | 10 |

| Example | Film | | | | |
|---|---|---|---|---|---|
| | Refractive index [—] | Haze [%] | Transmittance [%] | Film thickness [nm] | Classification |
| 54-1 | — | 0.83 | 99.2 | 680 | E |
| 54-2 | — | 0.50 | 99.5 | 500 | E |
| 54-3 | — | 0.60 | 99.4 | 950 | E |
| 54-4 | — | 0.40 | 99.6 | 500 | E |
| 55-1 | — | 1.32 | 98.7 | 1260 | E |
| 55-2 | — | 0.76 | 99.2 | 930 | E |
| 56-1 | — | 1.39 | 98.6 | 1930 | E |
| 56-2 | — | 1.03 | 99.0 | 1350 | E |
| 57-1 | — | 5.36 | 94.6 | 2790 | E |
| 57-2 | — | 1.10 | 98.9 | 1870 | E |
| 57-3 | 1.08 | 2.03 | 98.0 | 2390 | D |
| 57-4 | 1.17 | 0.22 | 99.8 | 780 | C |
| 58-1 | 1.07 | 1.97 | 98.0 | 2760 | D |

In the field of refractive index in the tables, "-" represents a non-uniform film of which a refractive index cannot be measured.

In addition, refractive indexes of AEROSIL 200, R812, R711, and R976 are 1.46.

According to Example 01-1 and Example 31-1, Example 02-1 and Example 32-1, and Example 06-1 and Example 36-1, in the case of a short-time dispersion process, a non-uniform film of which a refractive index cannot be measured and a film with low transmittance were produced. Meanwhile, in the case of a long-time dispersion process, films having a desired refractive index, transmittance, and film thickness were formed.

According to Example 01-1 and Example 32-3, and Example 02-2 and Example 33-1, when dispersion process conditions are the same, performing film formation using a coating liquid with a low concentration of fumed silica particle resulted in forming a film with high transmittance. Meanwhile, performing film formation using a high-concentration coating liquid resulted in lowering in the transmittance due to insufficient dispersion.

According to Example 05-1 and Example 35-2, when the dispersion process was performed for a short time, a film with a high porosity and a low refractive index was formed, but when the dispersion process was performed for a long time, since the three-dimensional structure of the fumed silica particles are destroyed, the porosity of the film is relatively lowered and the refractive index of the film relatively increased.

According to Example 05-2 and Example 35-1, when the concentration and the dispersion process conditions are the same, the film had a film thickness of 500 nm or more when the rotational speed in the spin coating method was low but had a film thickness of less than 500 nm when the rotational speed was high.

(Example II-1) Preparation of Coating Liquid 1

A coating liquid 1 was prepared by adding, to a dispersion A-1 (solid content concentration 9% by mass) of fumed silica particles (AEROSIL 200, manufactured by NIPPON AEROSIL CO., LTD.) dispersed in a 1-methoxy-2-propanol (PGME) solvent, a solution B (solid content concentration 50% by mass) obtained by dissolving silsesquioxane (OX-SQ SI-20, manufactured by TOAGOSEI CO., LTD.) in PGME and by further adding a solution obtained by dissolving a photocationic polymerization initiator (triarylsulfonium/special phosphorus-based anion salt CPI-210S, manufactured by San-Apro Ltd.) in PGME.

The fumed silica particle dispersion A-1 was obtained by subjecting the fumed silica particles AEROSIL 200, manufactured by NIPPON AEROSIL CO., LTD., to ball mill dispersion in PGME. A solid content mass ratio between the fumed silica particles and silsesquioxane was set to 10:1.5. An additive amount of the photopolymerization initiator was set to 0.4 parts relative to 100 parts of the silsesquioxane solid content.

(Example II-2) Preparation of Coating Liquid 2

A coating liquid preparation method similar to that of Example II-1 was performed with the exception of setting the solid content mass ratio between the fumed silica particles and silsesquioxane to 10:3.

(Example II-3) Preparation of Coating Liquid 3

A coating liquid preparation method similar to that of Example II-1 was performed with the exception of setting the solid content mass ratio between the fumed silica particles and silsesquioxane to 10:4.

(Example II-4) Preparation of Coating Liquid 4

A coating liquid preparation method similar to that of Example II-1 was performed with the exception of setting the solid content mass ratio between the fumed silica particles and silsesquioxane to 10:5.

(Example II-5) Preparation of Coating Liquid 5

A coating liquid preparation method similar to that of Example II-1 was performed with the exception of setting the solid content mass ratio between the fumed silica particles and silsesquioxane to 10:6.

(Example II-6) Preparation of Coating Liquid 6

A coating liquid 6 was prepared by adding, to a mixed solution of the dispersion A-1 (solid content concentration 9% by mass) of fumed silica particles (AEROSIL 200, manufactured by NIPPON AEROSIL CO., LTD.) dispersed in a 1-methoxy-2-propanol (PGME) solvent and a chain-like silica particle dispersion A-2 (solid content concentration 10% by mass) dispersed in a PGME solvent, the solution B (solid content concentration 50% by mass) obtained by dissolving silsesquioxane (OX-SQ SI-20, manufactured by TOAGOSEI CO., LTD.) in PGME and by further adding a solution obtained by dissolving a photocationic polymerization initiator (triarylsulfonium/special phosphorus-based anion salt CPI-210S, manufactured by San-Apro Ltd.) in PGME.

The chain-like silica particle dispersion A-2 was obtained by substituting a 2-propanol dispersion of chain-like silica particles (IPA-ST-UP, manufactured by Nissan Chemical Industries, Ltd.) with a PGME solvent. A solid content mass ratio between the fumed silica particles and the chain-like silica particles was set to 9.5:0.5. A solid content mass ratio between a total amount of the two types of particles and silsesquioxane was set to 10:1.5. An additive amount of the photopolymerization initiator was set to 0.4 parts relative to 100 parts of the silsesquioxane solid content.

(Example II-7) Preparation of Coating Liquid 7

A coating liquid preparation method similar to that of Example II-6 was performed with the exception of setting the solid content mass ratio between the fumed silica particles and the chain-like silica particles to 9.0:1.0.

(Example II-8) Preparation of Coating Liquid 8

A coating liquid preparation method similar to that of Example II-6 was performed with the exception of setting the solid content mass ratio between the fumed silica particles and the chain-like silica particles to 8.5:1.5.

(Example II-9) Preparation of Coating Liquid 9

A coating liquid preparation method similar to that of Example II-6 was performed with the exception of setting the solid content mass ratio between the fumed silica particles and the chain-like silica particles to 9.75:0.25 and setting the solid content mass ratio between the total amount of the two types of particles and silsesquioxane to 10:2.25.

(Example II-10) Preparation of Coating Liquid 10

A coating liquid preparation method similar to that of Example II-6 was performed with the exception of setting the solid content mass ratio between the total amount of the two types of particles and silsesquioxane to 10:2.25.

(Example II-11) Preparation of Coating Liquid 11

A coating liquid preparation method similar to that of Example II-1 was performed with the exception of replacing the fumed silica particle in Example II-1 with chain-like silica particles.

(Example II-12) Preparation of Coating Liquid 12

A coating liquid 12 was prepared by adding, to a mixed solution of the dispersion A-1 (solid content concentration 9% by mass) of fumed silica particles (AEROSIL 200, manufactured by NIPPON AEROSIL CO., LTD.) dispersed in a 1-methoxy-2-propanol (PGME) solvent and a hollow silica particle dispersion A-3 (solid content concentration 10% by mass) dispersed in a PGME solvent, the solution B (solid content concentration 50% by mass) obtained by dissolving silsesquioxane (OX-SQ SI-20, manufactured by TOAGOSEI CO., LTD.) in PGME and by further adding a solution obtained by dissolving a photocationic polymerization initiator (triarylsulfonium/special phosphorus-based anion salt CPI-210S, manufactured by San-Apro Ltd.) in PGME.

The hollow silica particle dispersion A-3 was obtained by substituting a 2-propanol dispersion of hollow silica particles (THRULYA 4110, manufactured by JGC Catalysts and Chemicals Ltd.) with PGME. A solid content mass ratio between the fumed silica particles and the hollow silica particles was set to 9.0:1.0. A solid content mass ratio between a total amount of the two types of particles and silsesquioxane was set to 10:1.5. An additive amount of the photopolymerization initiator was set to 0.4 parts relative to 100 parts of the silsesquioxane solid content.

(Example II-13) Preparation of Coating Liquid 13

A coating liquid preparation method similar to that of Example II-6 was performed with the exception of setting the solid content mass ratio between the fumed silica particles and the hollow silica particles to 9.5:0.5 and setting the solid content mass ratio between the total amount of the two types of particles and silsesquioxane to 10:3.

(Example II-14) Preparation of Coating Liquid 14

A coating liquid preparation method similar to that of Example II-6 was performed with the exception of setting the solid content mass ratio between the fumed silica particles and the hollow silica particles to 9.0:1.0 and setting the solid content mass ratio between the total amount of the two types of particles and silsesquioxane to 10:3.

(Example II-15) Preparation of Coating Liquid 15

A coating liquid preparation method similar to that of Example II-1 was performed with the exception of replacing the fumed silica particle in Example II-1 with hollow silica particles.

(Example II-16) Preparation of Coating Liquid 16

A coating liquid was prepared using the fumed silica particles in Example II-1 but without adding silsesquioxane and a photocationic polymerization initiator. A coating liquid preparation method similar to that of Example II-1 was performed.

(Example II-17) Preparation of Coating Liquid 17

A coating liquid preparation method similar to that of Example II-1 was performed with the exception of setting the solid content mass ratio between the fumed silica particles and silsesquioxane to 10:12.

[Fabrication of Film]

Using the coating liquids prepared in the respective examples II-1 to II-17, films were formed on substrates by the spin coating method. An S-LAH66 substrate (manufactured by OHARA INC.) was used as a substrate for evaluating optical characteristics (a refractive index and a transmittance), and a silicon substrate (product name: Flatness Dummy Wafer, manufacturer: E&M Corporation) as used as a substrate for evaluating film strength. Curing of the formed films was performed using a super high pressure mercury lamp device (EX250, manufactured by HOYA CANDEO OPTRONICS CORPORATION).

Irradiation intensity was set to 25 mW/cm$^2$ and irradiation time was set to 3 minutes.

Evaluation of the refractive index of the films was performed by the same method as described earlier or, in other words, the refractive index was calculated using a reflectance measurement device (USPM-RU III, manufactured by Olympus Corporation).

Evaluation of the average transmittance of the films was calculated by the method described earlier.

<Calculation Method of Porosity of Film>

Calculations of a porosity X (%) and a porosity Y (%) in films were performed as follows.

First, a film formed on a substrate was coated with a carbon film using Ion Beam Coater (IBC) model 681 (manufactured by Gatan, Inc.) and, after performing a cross section exposing process (30 kV, 0.1 nA) using an ion beam in a focused ion beam processing device (FIB-SEM: Nova600, manufactured by FEI), an SEM image was acquired by a scanning electron microscope (hereinafter, referred to as an SEM) under an accelerating voltage of 2 kV.

An observation magnification of the SEM image was set to a magnification which enables an entire film to be covered in at least a thickness direction and, at the same time, enables a shape of each hollow particle to be determined. Specifically, the observation magnification was set to around 50,000 times to 200,000 times.

In addition, a unit volume of the films was set to 1000 nm×1000 nm×(thickness direction) 100 nm.

To calculate a porosity in an acquired sectional SEM image, hollow particles and pores between the hollow particles were divided by binarization of a gray scale image and an area of each region was calculated. Image processing was performed using image analysis software Image J (NIH Image, available from https://imagej.nih.gov/ij).

Specifically, the porosity X (%) was calculated by multiplying the obtained area A (%) of the hollow particles by a volume fraction $V_a$ of internal pores relative to a total volume of the hollow particles as $X=A \times V_a$. In addition, the porosity Y (%) was calculated as Y=100−A.

In order to evaluate film strength, a diagonal cut was made with a surface and interfacial cutting analysis system (SAICAS-NN5, manufactured by DAIPLA WINTES CO., LTD.) from a surface of a sample to an interface between the film and the substrate using a diamond cutting blade to measure a horizontal force applied to the cutting blade during the diagonal cut, thereby obtaining a shear strength. Measurement conditions were as follows.

SAICAS-NN5 was used as the measuring device, the cutting blade was set to a blade width of 1 mm, a rake angle of 20°, and a relief angle of 10°, and a constant speed mode was adopted as a cutting mode. A value of a horizontal force at a cutting depth of 0.5 μm was used as an evaluated value of the film strength.

Table 2-1 shows obtained optical characteristics and evaluated values of film strength. In Table 2-1, FS denotes a fumed silica particle, CS denotes a chain-like silica particle, HS denotes a hollow silica particle, and SQ denotes silsesquioxane.

TABLE 2-1

| | Coating liquid | Solid content mass ratio | Refractive index | Transmittance (%) | Film strength (N/m) | Porosity (%) | Film thickness (nm) |
|---|---|---|---|---|---|---|---|
| Example II-1 | Coating liquid 1 | FS:SQ = 10:1.5 | 1.09 | 99.0 | 3.7 | 80.0 | 1450 |
| Example II-2 | Coating liquid 2 | FS:SQ = 10:3 | 1.11 | 98.3 | 5.5 | 75.6 | 1270 |
| Example II-3 | Coating liquid 3 | FS:SQ = 10:4 | 1.14 | 97.9 | 7.3 | 68.9 | 1140 |
| Example II-4 | Coating liquid 4 | FS:SQ = 10:5 | 1.15 | 97.2 | 10.1 | 66.7 | 1170 |

TABLE 2-1-continued

| | Coating liquid | Solid content mass ratio | Refractive index | Transmittance (%) | Film strength (N/m) | Porosity (%) | Film thickness (nm) |
|---|---|---|---|---|---|---|---|
| Example II-5 | Coating liquid 5 | FS:SQ = 10:6 | 1.15 | 95.3 | 14.0 | 66.7 | 1260 |
| Example II-6 | Coating liquid 6 | FS:CS:SQ = 9.5:0.5:1.5 | 1.12 | 99.2 | 4.1 | 73.3 | 1000 |
| Example II-7 | Coating liquid 7 | FS:CS:SQ = 9.0:1.0:1.5 | 1.12 | 99.3 | 4.1 | 73.3 | 980 |
| Example II-8 | Coating liquid 8 | FS:CS:SQ = 8.5:1.5:1.5 | 1.13 | 99.4 | 4.1 | 71.1 | 930 |
| Example II-9 | Coating liquid 9 | FS:CS:SQ = 9.75:0.25:1.5 | 1.12 | 99.0 | 5.1 | 73.3 | 1070 |
| Example II-10 | Coating liquid 10 | FS:CS:SQ = 9.5:0.5:2.25 | 1.12 | 99.1 | 5.2 | 73.3 | 990 |
| Example II-11 | Coating liquid 11 | CS:SQ = 10:1.5 | 1.27 | 99.9 | 12.1 | 40.0 | 840 |
| Example II-12 | Coating liquid 12 | FS:HS:SQ = 9.0:1.0:1.5 | 1.12 | 99.1 | 3.9 | 73.3 | 1160 |
| Example II-13 | Coating liquid 13 | FS:HS:SQ = 9.5:0.5:3 | 1.12 | 98.4 | 6.0 | 73.3 | 1200 |
| Example II-14 | Coating liquid 14 | FS:HS:SQ = 9.0:1.0:3 | 1.15 | 98.6 | 6.2 | 66.7 | 1140 |
| Example II-15 | Coating liquid 15 | HS:SQ = 10:1.5 | 1.20 | 99.9 | 20.5 | 55.6 | 690 |
| Example II-16 | Coating liquid 16 | FS:SQ = 10:0 | 1.08 | 99.3 | 1.6 | 82.2 | 1760 |
| Example II-17 | Coating liquid 17 | FS:SQ = 10:12 | 1.17 | 77.1 | 30.9 | 62.2 | 1190 |

<Preparation of Film-Forming Coating Liquid and Film Formation>

A hollow silica particle with an outer shell constituted by silica was selected as the hollow particle for forming a film. To prepare the film-forming coating liquid, THRULYA 4110 (dispersion medium: IPA, silica solid content concentration: 20.5% by mass, number-average particle diameter of one hollow particle: 60 nm, porosity of one hollow particle: 45%, and refractive index of one hollow particle: 1.25) manufactured by JGC Catalysts and Chemicals Ltd. was used as a hollow silica particle 1 and THRULYA 1110 (dispersion medium: IPA, silica solid content concentration: 20.5% by mass, number-average particle diameter of one hollow particle: 50 nm, porosity of one hollow particle: 35%, and refractive index of one hollow particle: 1.30) manufactured by JGC Catalysts and Chemicals Ltd. was used as a hollow silica particle 2.

The dispersion medium of THRULYA 4110, isopropyl alcohol (IPA), was substituted with propylene glycol-monomethylether (hereinafter, also referred to as PGME) to obtain a hollow silica particle 1-PGME dispersion with a silica solid content concentration of 18% by mass. The hollow silica particle 1-PGME dispersion was diluted with PGME to prepare a hollow silica particle 1-PGME dispersion (hereinafter, also referred to as a hollow silica particle dispersion 1) with a desired silica solid content concentration.

The dispersion medium of THRULYA 1110, IPA, was substituted with PGME to obtain a hollow silica particle 2-PGME dispersion with a silica solid content concentration of 18% by mass. The hollow silica particle 2-PGME dispersion was diluted with PGME to prepare a hollow silica particle 2-PGME dispersion (hereinafter, also referred to as a hollow silica particle dispersion 2) with a desired silica solid content concentration.

A thermosetting silsesquioxane (AC-SQ TA-100, manufactured by TOAGOSEI CO., LTD.) having an acrylic group was used as a binder. TA-100 was dissolved in PGME (hereinafter, referred to as a binder solution) so as to have a content of 50% by mass.

A methacryl-modified silicone oil (X-22-164, manufactured by Shin-Etsu Chemical Co., Ltd.), tetraethoxysilane (TEOS), or triethoxyvinylsilane (TEVS) was used as a flocculant.

The film-forming coating liquid was obtained by adding prescribed amounts of the binder solution and the flocculant to a hollow silica particle dispersion of a prescribed type and a prescribed amount. The film-forming coating liquid was applied onto a substrate (S-LAH66) by a spin coating method and heated at 180° C. for 10 minutes with a hot plate to obtain a film. Although X-22-164, TEOS, and TEVS all have an effect of agglomerating hollow silica particles, since these compounds volatilize at 120° C. to 150° C., no agglomeration remained in the film.

Details of film formation conditions of the films in the respective examples are shown in Table 3-1 and physical properties of the obtained films are shown in Table 3-2.

The methods described above were used to measure the refractive index, the porosity, the thickness, and the strength of the films.

Since porosities are calculated based on an analysis of sectional SEM images, errors may occur in the porosities. Therefore, strictly speaking, assigning the values in Table 3-2 into expressions (1) to (4) may not result in satisfying the equality signs. However, by assuming that the refractive index has an error of ±0.01 and the porosity has an error of ±2% points, expressions (1) to (4) can be considered appropriate approximations.

Example III-1

Figure 12:
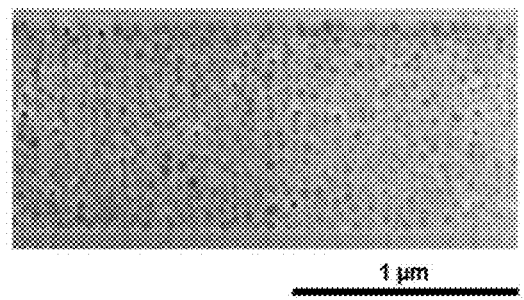
FIG. 12 represents an SEM image of a film formed in example III-1.

The hollow silica particle dispersion 1 with a silica solid content concentration of 12% by mass was adopted as a coating liquid. The coating liquid was applied and then heated to form a film. FIG. 12 shows an SEM image of the obtained film.

Example III-2

Figure 13:
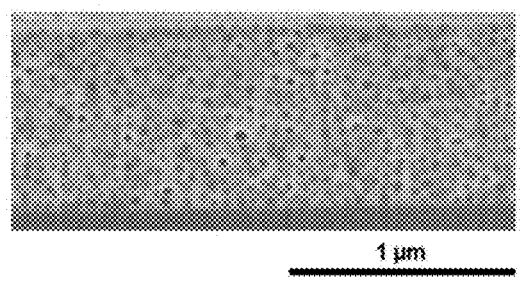
FIG. 13 represents an SEM image of a film formed in example III-2.

A coating liquid was prepared by adding 0.18 g of the binder solution to the hollow silica particle dispersion 1 (3.0 g) with a silica solid content concentration of 12% by mass. The coating liquid was applied and then heated to form a film. FIG. 13 shows an SEM image of the obtained film.

Example III-3

Figure 14:
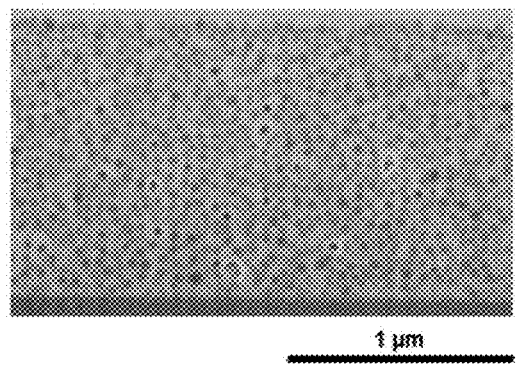
FIG. 14 represents an SEM image of a film formed in example III-3.

A coating liquid was prepared by adding 0.2 mL of the flocculant to the hollow silica particle dispersion 1 (3.0 g) with a silica solid content concentration of 12% by mass. The coating liquid was applied and then heated to form a film. FIG. 14 shows an SEM image of the obtained film.

Example III-4

Figure 15:
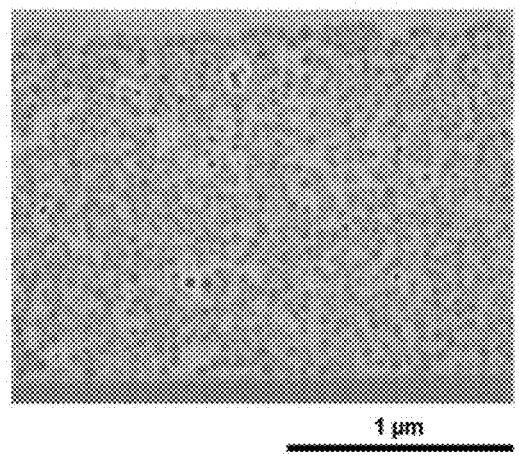
FIG. 15 represents an SEM image of a film formed in example III-4.

A coating liquid was prepared by adding 1.4 mL of the flocculant to the hollow silica particle dispersion 1 (3.0 g) with a silica solid content concentration of 12% by mass. The coating liquid was applied and then heated to form a film. FIG. 15 shows an SEM image of the obtained film.

Example III-5

Figure 16:
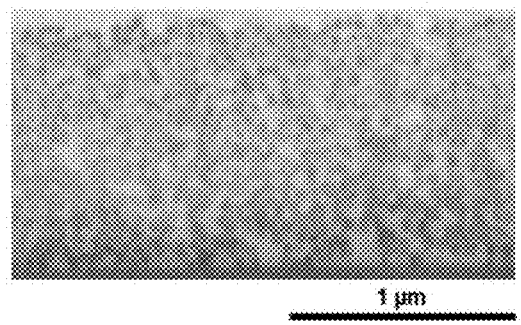
FIG. 16 represents an SEM image of a film formed in example III-5.

A coating liquid was prepared by adding 0.18 g of the binder solution and 1.0 mL of the flocculant to the hollow silica particle dispersion 1 (3.0 g) with a silica solid content concentration of 15% by mass. The coating liquid was applied and then heated to form a film. FIG. 16 shows an SEM image of the obtained film.

Example III-6

A coating liquid was prepared by adding 2.0 mL of the flocculant to the hollow silica particle dispersion 1 (3.0 g) with a silica solid content concentration of 9% by mass. The coating liquid was applied and then heated to form a film. Since the hollow silica particles agglomerated vigorously in the coating liquid, the obtained film was turbid.

Example III-7

A coating liquid was prepared by adding 0.54 g of the binder solution to the hollow silica particle dispersion 1 (3.0 g) with a silica solid content concentration of 9% by mass. The coating liquid was applied and then heated to form a film.

Example III-8

A chain-like silica particle dispersion with a silica solid content concentration of 9% by mass was prepared in a similar manner to that described above with the exception of changing THRULYA 4110 to WA-ST-UP (an IPA dispersion of chain-like silica particles, manufactured by Nissan Chemical Industries, Ltd.). A coating liquid was prepared in a similar manner to that described above with the exception of changing the hollow silica particle dispersion to the chain-like silica particle dispersion. The coating liquid was applied and then heated to form a film.

Examples III-9 to III-20

Coating liquids were prepared by changing a type and an amount of the hollow silica particle dispersion, an amount of the binder solution, a type and an amount of the flocculant, and spin coating conditions and heating conditions to those described in Table 3-1, and the obtained coating liquids were applied and then heated to form films.

TABLE 3-1

| | | Physical properties of silica particle | | | | Coating liquid composition | | | | Spin coating conditions | | Heating process | |
| | | Number-average particle diameter [nm] | Porosity [%] | Refractive index [—] | Flocculant | Dispersion Concentration [% by mass] | Mass [g] | Binder solution [g] | Flocculant [ml] | Rotational speed [rpm] | Time [sec] | Temperature [° C.] | Time [min] |
| | Particle | | | | | | | | | | | | |
|---|---|---|---|---|---|---|---|---|---|---|---|---|---|
| Example III-1 | Hollow silica particle 1 | 60 | 45 | 1.25 | X-22-164 | 12 | 3.0 | 0.00 | 0.0 | 1000 | 10 | 180 | 10 |
| Example III-2 | Hollow silica particle 1 | 60 | 45 | 1.25 | X-22-164 | 12 | 3.0 | 0.18 | 0.0 | 1000 | 10 | 180 | 10 |
| Example III-3 | Hollow silica particle 1 | 60 | 45 | 1.25 | X-22-164 | 12 | 3.0 | 0.00 | 0.2 | 1000 | 10 | 180 | 10 |
| Example III-4 | Hollow silica particle 1 | 60 | 45 | 1.25 | X-22-164 | 12 | 3.0 | 0.00 | 1.4 | 1000 | 10 | 180 | 10 |
| Example III-5 | Hollow silica particle 1 | 60 | 45 | 1.25 | X-22-164 | 15 | 3.0 | 0.18 | 1.0 | 1000 | 10 | 180 | 10 |
| Example III-6 | Hollow silica particle 1 | 60 | 45 | 1.25 | X-22-164 | 9 | 3.0 | 0.00 | 2.0 | 1000 | 10 | 180 | 10 |
| Example III-7 | Hollow silica particle 1 | 60 | 45 | 1.25 | X-22-164 | 9 | 3.0 | 0.54 | 0.0 | 2000 | 10 | 180 | 10 |
| Example III-8 | Chain-like silica particle | 15 | 0 | 1.46 | X-22-164 | 9 | 3.0 | 0.00 | 0.0 | 2000 | 10 | 180 | 10 |
| Example III-9 | Hollow silica particle 2 | 50 | 35 | 1.30 | X-22-164 | 12 | 3.0 | 0.00 | 0.0 | 1000 | 10 | 180 | 10 |
| Example III-10 | Hollow silica particle 2 | 50 | 35 | 1.30 | X-22-164 | 9 | 3.5 | 0.00 | 1.5 | 1000 | 10 | 180 | 10 |
| Example III-11 | Hollow silica particle 2 | 50 | 35 | 1.30 | X-22-164 | 12 | 3.0 | 0.18 | 1.3 | 1000 | 10 | 180 | 10 |
| Example III-12 | Hollow silica particle 2 | 50 | 35 | 1.30 | X-22-164 | 15 | 3.0 | 0.18 | 1.4 | 1000 | 10 | 180 | 10 |
| Example III-13 | Hollow silica particle 2 | 50 | 35 | 1.30 | TEOS | 10 | 3.0 | 0.00 | 2.0 | 1000 | 10 | 180 | 10 |
| Example III-14 | Hollow silica particle 1 | 60 | 45 | 1.25 | TEOS | 10 | 3.0 | 0.00 | 2.0 | 1000 | 10 | 180 | 10 |
| Example III-15 | Hollow silica particle 2 | 50 | 35 | 1.30 | TEOS | 12 | 2.5 | 0.00 | 2.5 | 1000 | 10 | 180 | 10 |
| Example III-16 | Hollow silica particle 1 | 60 | 45 | 1.25 | TEOS | 12 | 2.5 | 0.00 | 2.5 | 1000 | 10 | 180 | 10 |
| Example III-17 | Hollow silica particle 2 | 50 | 35 | 1.30 | TEVS | 10 | 3.0 | 0.00 | 2.0 | 1000 | 10 | 180 | 10 |
| Example III-18 | Hollow silica particle 1 | 60 | 45 | 1.25 | TEVS | 10 | 3.0 | 0.00 | 2.0 | 1000 | 10 | 180 | 10 |
| Example III-19 | Hollow silica particle 2 | 50 | 35 | 1.30 | TEVS | 12 | 2.5 | 0.00 | 2.5 | 1000 | 10 | 180 | 10 |
| Example III-20 | Hollow silica particle 1 | 60 | 45 | 1.25 | TEVS | 12 | 2.5 | 0.00 | 2.5 | 1000 | 10 | 180 | 10 |

TABLE 3-2

| | Volume fraction [%] | | | | Refractive index [—] | Transmittance [%] | Film thickness [nm] | Film strength [N/m] |
|---|---|---|---|---|---|---|---|---|
| | Pore inside particle (X) | Pore between particles (Y) | Sum of pores (X + Y) | Total solid content (100 − X − Y) | | | | |
| Example III-1 | 25.1 | 44.3 | 69.4 | 30.6 | 1.132 | 99.9 | 1060 | 6.0 |
| Example III-2 | 23.8 | 47.1 | 70.9 | 29.1 | 1.155 | 99.5 | 1020 | 20.5 |
| Example III-3 | 18.4 | 59.2 | 77.6 | 22.4 | 1.105 | 100.0 | 1630 | — |
| Example III-4 | 15.9 | 64.7 | 80.6 | 19.4 | 1.084 | 99.8 | 1860 | — |
| Example III-5 | 17.6 | 60.8 | 78.4 | 21.6 | 1.107 | 99.6 | 1900 | 12.3 |
| Example III-6 | — | — | — | — | — | 84.6 | — | — |
| Example III-7 | 33.1 | 5.0 | 38.1 | 61.9 | 1.284 | 99.0 | 830 | — |
| Example III-8 | 0.0 | 51.2 | 51.2 | 48.8 | 1.224 | 99.9 | 500 | 4.5 |
| Example III-9 | 17.7 | 49.2 | 66.9 | 31.2 | 1.152 | 99.2 | 1150 | — |
| Example III-10 | 9.7 | 72.4 | 82.1 | 17.9 | 1.082 | 99.6 | 1020 | — |
| Example III-11 | 12.5 | 64.1 | 76.6 | 23.4 | 1.108 | 99.4 | 1030 | — |
| Example III-12 | — | — | — | — | — | 98.6 | 2590 | — |
| Example III-13 | 10.7 | 69.3 | 80.0 | 20.0 | 1.092 | 99.6 | 870 | — |
| Example III-14 | 20.2 | 55.9 | 76.1 | 23.9 | 1.110 | 99.5 | 1180 | — |
| Example III-15 | — | — | — | — | — | 95.9 | — | — |
| Example III-16 | — | — | — | — | — | 95.8 | — | — |
| Example III-17 | 11.8 | 66.3 | 78.1 | 21.9 | 1.101 | 99.7 | 910 | — |
| Example III-18 | 19.9 | 56.4 | 76.3 | 23.7 | 1.109 | 99.9 | 790 | — |
| Example III-19 | — | — | — | — | — | 94.7 | — | — |
| Example III-20 | — | — | — | — | — | 94.7 | — | — |

In Table 3-2, values of the refractive indexes of the films are actual measured values measured based on the measurement method described above.

In addition, in Table 3-2, values of porosities of the films are values calculated based on an analysis of an SEM image with respect to Examples III-1 to 111-8 and calculation values calculated using expression (3) from the refractive indexes with respect to Examples 111-9 to 111-20.

Since the photoelectric conversion device according to the present disclosure is a cavity-less structure in which a solid substance is arranged between a microlens array and a light-transmitting plate, the photoelectric conversion device has a higher strength than a cavity structure. In addition, since the use of a film as the solid substance arranged between the microlenses and the light-transmitting plate enables microlenses made of resin or the like with a moderate refractive index to be used, the photoelectric conversion device can be manufactured at low cost while maintaining a condensing property comparable to that of a cavity structure.

Furthermore, since the functional film according to the present disclosure is capable of realizing a low refractive index, a high transmittance, a large film thickness, and high strength, the functional film can be applied and diverted to optical devices requiring at least any of high performance, high strength, small size, and low cost. An optical device includes a substrate and the functional film arranged on the substrate. While a photoelectric conversion device such as an image sensor has been exemplified as an optical device, forming such a functional film on a substrate for realizing functions of a lens, a filter, a mirror, or the like in an optical device enables a superior optical device to be provided. For example, when the optical device is a lens, a coating of the functional film may be provided on a lens substrate or spaces between a plurality of lens substrates may be filled with the functional film. An optical equipment including such a lens (optical device) may be a lens barrel having a lens group constituted by a plurality of lenses, and the lens barrel may be an interchangeable lens mountable to an interchangeable lens camera. The interchangeable lens may have a moving device such as a motor for moving the lens.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-088352, filed May 1, 2018, and Japanese Patent Application No. 2019-063132, filed Mar. 28, 2019, which are hereby incorporated by reference herein in their entirety.

What is claimed is:

1. A photoelectric conversion device, comprising:
   a photoelectric conversion substrate having a plurality of photoelectric conversion portions and a microlens array arranged on the plurality of photoelectric conversion portions;
   a light-transmitting plate covering the microlens array; and
   a film arranged between the microlens array and the light-transmitting plate,
   wherein the film has:
   a refractive index within a range from 1.05 to 1.15,
   an average transmittance of light in a wavelength region within a range from 400 nm to 700 nm of 98.5% or higher, and
   a film thickness within a range from 500 nm to 5000 nm,
   wherein the film contains a plurality of hollow particles and pores between the hollow particles, and
   wherein a ratio of a total volume of the pores between the hollow particles relative to a unit volume of the film is within a range from 30.0% to 80.0%.

2. The photoelectric conversion device according to claim 1, wherein a porosity of the film is within a range from 65.0% to 90.0%.

3. The photoelectric conversion device according to claim 1, wherein the film contains a solid substance, and
   a main component of the solid substances is silica and/or a refractive index of the solid substance is within a range from 1.20 to 1.60.

4. The photoelectric conversion device according to claim 3, wherein the film contains at least one particle selected from the group consisting of a secondary particle in which primary particles constituted by the solid substance form a three-dimensional structure, a chain-like secondary particle in which primary particles constituted by the solid substance are connected to each other in a chain shape, and a branched chain-like secondary particle in which primary particles constituted by the solid substance are connected to each other in a branched-chain shape.

5. The photoelectric conversion device according to claim 4, wherein a number-average particle diameter of a primary particle constituted by the solid substance is within a range from 5 nm to 100 nm.

6. The photoelectric conversion device according to claim 4, wherein a number-average particle diameter of the secondary particle is within a range from 50 nm to 500 nm.

7. The photoelectric conversion device according to claim 3, wherein, assuming that a ratio of a total volume of pores inside the plurality of hollow particles relative to the unit volume of the film is taken as a porosity X (%) and the ratio of the total volume of the pores between the hollow particles relative to the unit volume of the film is taken as a porosity Y (%), a relationship expressed as X<Y is satisfied.

8. The photoelectric conversion device according to claim 7, wherein the X and the Y satisfy a relationship expressed as X<(100−X−Y)<Y.

9. The photoelectric conversion device according to claim 3, wherein the film contains particles constituted by the solid substance and a binder for binding the particles.

10. The photoelectric conversion device according to claim 9, wherein a content of the binder in the film is within a range from 7.0 parts by mass to 30.0 parts by mass relative to 100 parts by mass of the particles of the solid substance.

11. The photoelectric conversion device according to claim 9, wherein the binder contains siloxane.

12. The photoelectric conversion device according to claim 9, wherein the binder contains a substance having a T3 unit structure represented by a composition formula $[R^1(SiO_{1.5})_n]$, and the $R^1$ represents at least one selected from the group consisting of a polymerizable group, a hydroxy group, a chlorine atom, an alkyl group with 1 to 6 carbons, and an alkoxy group with 1 to 6 carbons.

13. The photoelectric conversion device according to claim 12, wherein the $R^1$ is at least one polymerizable group selected from the group consisting of an acryloyl group, a methacryloyl group, an oxetanyl group, and an epoxy group.

14. The photoelectric conversion device according to claim 3, wherein the silica has at least one of an organic group and a hydroxy group on a surface thereof.

15. The photoelectric conversion device according to claim 1, wherein a surface of the film on a side of the light-transmitting plate is flatter than a surface of the film on a side of the microlens array.

16. The photoelectric conversion device according to claim 1, wherein the microlens array contains a resin material.

17. The photoelectric conversion device according to claim 1, wherein a strength of the film as measured by a SAICAS method is within a range from 3.0 N/m to 100.0 N/m.

18. The photoelectric conversion device according to claim 17, wherein a strength of the film as measured by a SAICAS method is within a range from 3.0 N/m to 25.0 N/m.

19. An equipment, comprising:
the photoelectric conversion device according to claim 1; and
at least one selected from the group consisting of an optical system for forming an optical image on the photoelectric conversion device, a control device which controls the photoelectric conversion device, a processing device which processes a signal output from the photoelectric conversion device, a moving device which moves the photoelectric conversion device, and a display device which displays information based on a signal output from the photoelectric conversion device.

20. A photoelectric conversion device, comprising:
a photoelectric conversion substrate having a plurality of photoelectric conversion portions and a microlens array arranged on the plurality of photoelectric conversion portions;
a light-transmitting plate covering the microlens array; and
a film arranged between the microlens array and the light-transmitting plate,
wherein the film contains a plurality of hollow particles,
wherein, assuming that a ratio of a total volume of pores inside the plurality of hollow particles relative to a unit volume of the film is taken as a porosity X (%) and a ratio of a total volume of pores between the hollow particles relative to the unit volume of the film is taken as a porosity Y (%), a relationship expressed as X<Y is satisfied, and
wherein Y is within a range from 30.0% to 80.0%.

21. The photoelectric conversion device according to claim 20, wherein the X and the Y satisfy a relationship expressed as X<(100−X−Y)<Y.

22. The photoelectric conversion device according to claim 20, wherein a sum (X+Y) of the X and the Y is within a range from 65.0% to 90.0%.

23. The photoelectric conversion device according to claim 20, wherein the X is within a range from 8.0% to 32.0%.

24. The photoelectric conversion device according to claim 20, wherein the X is within a range from 12.0% to 24.0% and the Y is within a range from 40.0% to 70.0%.

25. The photoelectric conversion device according to claim 20, wherein a main component of a solid substance surrounding the pore inside the hollow particle is silica.

26. The photoelectric conversion device according to claim 25, wherein the film contains a binder which binds the plurality of particles, and the binder contains siloxane.

27. The photoelectric conversion device according to claim 20, wherein a number-average particle diameter of a primary particle constituted by the hollow particle is within a range from 20 nm to 100 nm.

28. The photoelectric conversion device according to claim 20, wherein a porosity $n_p$ of one hollow particle is within a range from 30.0% to 70.0%.

29. The photoelectric conversion device according to claim 20, wherein a film thickness of the film is within a range from 500 nm to 2000 nm.

30. The photoelectric conversion device according to claim 20, wherein the unit volume is 1000 nm×1000 nm× (thickness direction) 100 nm.

31. The photoelectric conversion device according to claim 1, wherein the ratio of the total volume of the pores between the hollow particles relative to the unit volume of the film is within a range from 40.0% to 70.0%.

32. The photoelectric conversion device according to claim 20, wherein the Y is within a range from 40.0% to 70.0%.

* * * * *